US011394006B2

(12) United States Patent
Choi et al.

(10) Patent No.: US 11,394,006 B2
(45) Date of Patent: Jul. 19, 2022

(54) DISPLAY PANEL

(71) Applicant: Samsung Display Co., Ltd., Yongin-si (KR)

(72) Inventors: Wonwoo Choi, Yongin-si (KR); Wooyong Sung, Yongin-si (KR); Sooyoun Kim, Yongin-si (KR); Junghan Seo, Yongin-si (KR); Seoyeon Lee, Yongin-si (KR); Hyoungsub Lee, Yongin-si (KR); Moonwon Chang, Yongin-si (KR); Seunggun Chae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 277 days.

(21) Appl. No.: 16/474,051

(22) PCT Filed: Dec. 4, 2018

(86) PCT No.: PCT/KR2018/015237
§ 371 (c)(1),
(2) Date: Jun. 26, 2019

(87) PCT Pub. No.: WO2020/054915
PCT Pub. Date: Mar. 19, 2020

(65) Prior Publication Data
US 2021/0234122 A1    Jul. 29, 2021

(30) Foreign Application Priority Data

Sep. 11, 2018  (KR) ........................ 10-2018-0108528

(51) Int. Cl.
*H01L 51/52*    (2006.01)
*H01L 27/32*    (2006.01)
*H01L 51/56*    (2006.01)

(52) U.S. Cl.
CPC ...... *H01L 51/5253* (2013.01); *H01L 27/3246* (2013.01); *H01L 27/3258* (2013.01); *H01L 51/56* (2013.01); *H01L 2227/323* (2013.01)

(58) Field of Classification Search
CPC ............. H01L 51/5253; H01L 27/3246; H01L 2227/323
(Continued)

(56) References Cited

U.S. PATENT DOCUMENTS 9,632,487 B2   4/2017 Kim et al.
9,634,074 B2   4/2017 Son et al.
(Continued)

FOREIGN PATENT DOCUMENTS

KR  10-2016-0076688   7/2016
KR  10-2016-0096760   8/2016
(Continued)

OTHER PUBLICATIONS

International Search Report and Written Opinion of the International Searching Authority dated May 30, 2019, issued in International Application No. PCT/KR2018/015237.

*Primary Examiner* — Dzung Tran
(74) *Attorney, Agent, or Firm* — H.C. Park & Associates, PLC

(57) ABSTRACT

A display panel including: a substrate including an opening area and a display area surrounding the opening area; a plurality of display elements, each including a pixel electrode, an emission layer, and an opposite electrode, the plurality of display elements being located in the display area; a thin-film encapsulation layer covering the plurality of display elements and including an organic encapsulation layer and an inorganic encapsulation layer; a plurality of grooves located between the opening area and the display area, the plurality of grooves being concave in a depth
(Continued)

direction of the substrate and having an undercut structure; and a partition wall located between neighboring grooves among the plurality of grooves.

10 Claims, 21 Drawing Sheets

(58) Field of Classification Search
  USPC .......................................................... 257/88
  See application file for complete search history.

(56) References Cited

U.S. PATENT DOCUMENTS

| | | | |
|---|---|---|---|
| 9,905,629 | B2 | 2/2018 | Kim et al. |
| 10,135,025 | B2 | 11/2018 | Kim et al. |
| 10,224,506 | B2 | 3/2019 | Shin |
| 2009/0322657 | A1* | 12/2009 | Na .................. H01L 27/3246 345/76 |
| 2013/0270526 | A1* | 10/2013 | Kim .................. H01L 27/1255 257/40 |
| 2015/0076476 | A1* | 3/2015 | Odaka ................ H01L 27/3258 257/40 |
| 2016/0233289 | A1* | 8/2016 | Son ........................ H01L 51/52 |
| 2016/0270209 | A1* | 9/2016 | Cho .................... H01L 51/5203 |
| 2017/0026553 | A1 | 1/2017 | Lee et al. |
| 2017/0150618 | A1 | 5/2017 | Choi et al. |
| 2017/0162637 | A1 | 6/2017 | Choi et al. |
| 2017/0355313 | A1 | 12/2017 | Park et al. |
| 2018/0159075 | A1 | 6/2018 | Kim et al. |

FOREIGN PATENT DOCUMENTS

| | | |
|---|---|---|
| KR | 10-2017-0015632 | 2/2017 |
| KR | 10-2017-0057911 | 5/2017 |
| KR | 10-2017-0059527 | 5/2017 |
| KR | 10-2017-0066767 | 6/2017 |
| KR | 10-2017-0096646 | 8/2017 |
| KR | 10-2017-0115177 | 10/2017 |
| KR | 10-2017-0141311 | 12/2017 |
| KR | 10-2018-0063962 | 6/2018 |

* cited by examiner

DISPLAY PANEL

CROSS REFERENCE TO RELATED APPLICATIONS

This application is a National Stage Entry of International Application No. PCT/KR2018/015237, filed on Dec. 4, 2018, and claims priority from and the benefit of Korean Patent Application No. 10-2018-0108528, filed on Sep. 11, 2018, each of which is hereby incorporated by reference for all purposes as if fully set forth herein.

BACKGROUND

Field

Exemplary embodiments of the invention relate generally to a display panel including grooves and a display device including the display panel.

Discussion of the Background

Recently, the purposes of display devices have diversified. In addition, as display devices have become thinner and more lightweight, their range of use has gradually been extended.

As an area occupied by a display area of display devices increases, functions that may be combined or associated with the display device are being added. As a way of adding various functions while increasing the size of the display area, research into a display device including an opening in the display area is in progress.

Display devices of the prior art, which include an opening, are subject to contamination by foreign substances, such as moisture, which may penetrate through a lateral side of the opening. In this case, display elements surrounding the opening may be damaged.

The above information disclosed in this Background section is only for understanding of the background of the inventive concepts, and, therefore, it may contain information that does not constitute prior art.

SUMMARY

Exemplary embodiments of the invention provide a display panel that may prevent passage of moisture through an opening and a display device including the display panel. However, it should be understood that exemplary embodiments described herein should be considered in a descriptive sense only and not for limitation of the disclosure.

Additional features of the inventive concepts will be set forth in the description which follows, and in part will be apparent from the description, or may be learned by practice of the inventive concepts.

An exemplary embodiment of the invention provides a display panel including: a substrate including an opening area and a display area surrounding the opening area; a plurality of display elements, each including a pixel electrode, an emission layer, and an opposite electrode, the plurality of display elements being located in the display area; a thin-film encapsulation layer covering the plurality of display elements and including an organic encapsulation layer and an inorganic encapsulation layer; a plurality of grooves located between the opening area and the display area, the plurality of grooves being concave in a depth direction of the substrate and having an undercut structure; and a partition wall located between neighboring grooves among the plurality of grooves.

The partition wall may include at least one partition wall layer including an organic insulating material.

The display panel may further include: an inorganic layer interposed between the substrate and the at least one partition wall layer, wherein a top surface and a lateral surface of the inorganic layer may be covered by the at least one partition wall layer.

The display panel may further include: a pixel-defining layer located in the display area, covering edges of the pixel electrode, and including an opening corresponding to the pixel electrode; and a spacer arranged on a top surface of the pixel-defining layer.

A first height from the substrate to a top surface of the partition wall may be less than a second height from the substrate to a top surface of the spacer.

A difference between the first height and the second height may be greater than or equal to 1 μm.

The first height may be greater than a third height from the substrate to the top surface of the pixel-defining layer and less than the second height.

The pixel-defining layer and the spacer may include an organic insulating material.

A width of a bottom surface of the partition wall may be less than a horizontal distance between the neighboring grooves.

The partition wall may have a ring shape surrounding the opening.

Another exemplary embodiment of the invention provides a display panel including: a substrate including an opening; display elements located in a display area, the display area at least partially surrounding the opening; a thin-film encapsulation layer located on the display elements and including an organic encapsulation layer and an inorganic encapsulation layer; a plurality of grooves located in a groove area between the opening and the display area; and a partition wall located in the groove area and arranged between neighboring grooves among the plurality of grooves.

The substrate may include a base layer and a barrier layer on the base layer, and each of the plurality of grooves may include: a first hole that passes through the barrier layer; and a recess or a second hole that passes through the base layer.

A lateral surface of the barrier layer may protrude further toward a center of the first hole than a lateral surface of the base layer, wherein the lateral surface of the barrier layer defines the first hole, and the lateral surface of the base layer defines the recess or the second hole.

The partition wall may include at least one partition wall layer including an organic insulating material.

At least one inorganic layer may be arranged between the substrate and the at least one partition wall layer, and a top surface and a lateral surface of the at least one inorganic layer may be covered by the at least one partition wall layer.

The at least one inorganic layer and the partition wall may be located between the neighboring grooves and may have a ring shape surrounding the opening.

The display panel may further include: a pixel-defining layer located in the display area, covering edges of a pixel electrode of each of the display elements, and including an opening corresponding to the pixel electrode; and a spacer arranged on a top surface of the pixel-defining layer, wherein a first height from the substrate to a top surface of the partition wall may be less than a second height from the substrate to a top surface of the spacer.

The first height may be greater than a third height from the substrate to the top surface of the pixel-defining layer and less than the second height.

A width of a bottom surface of the partition wall may be less than a horizontal distance between the neighboring grooves.

The display panel may further include: a planarization layer located in the groove area.

These and/or other aspects will become apparent and more readily appreciated from the following description of the embodiments, taken in conjunction with the accompanying drawings.

A display panel according to exemplary embodiments may prevent damage to display elements through grooves and a structure of a partition wall between neighboring grooves. However, this effect is provided merely as an example, and the scope of the inventive concept is not limited by this effect.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
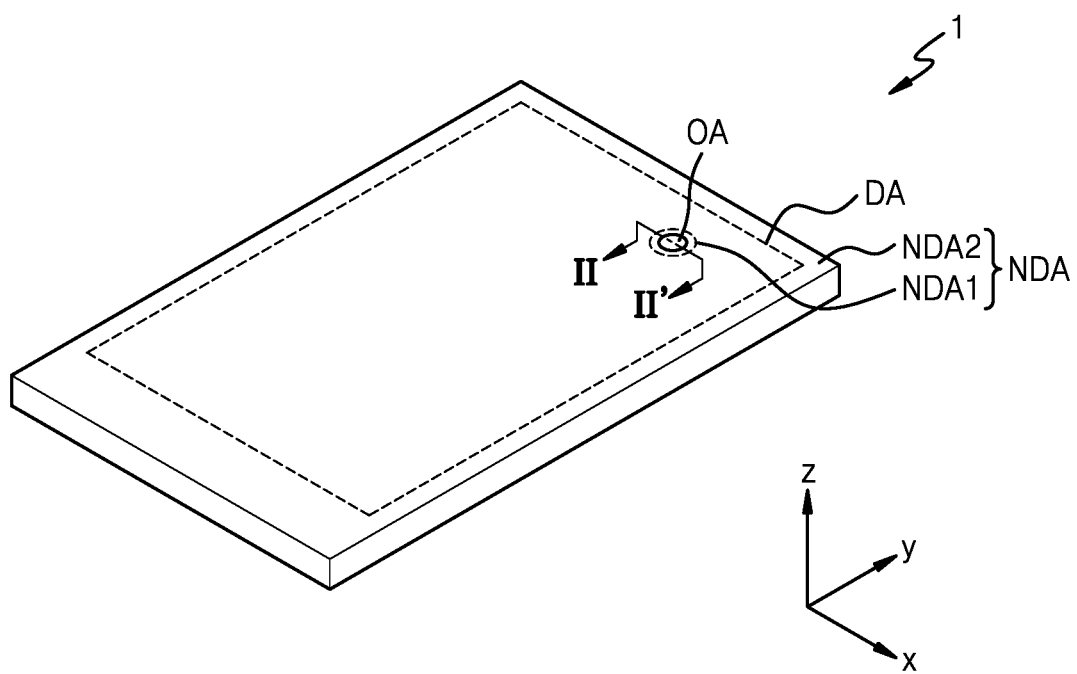
FIG. 1 is a perspective view of a display device according to an exemplary embodiment.

As the disclosure allows for various changes and numerous embodiments, example embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

Hereinafter, the disclosure will be described more fully with reference to the accompanying drawings, in which exemplary embodiments of the disclosure are shown. When description is made with reference to the drawings, like reference numerals in the drawings denote like or corresponding elements, and repeated description thereof will be omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

FIG. 1 is a perspective view of a display device according to an exemplary embodiment.

Referring to FIG. 1, the display device 1 includes a display area DA that emits light and a non-display area NDA that does not emit light. The non-display area NDA is adjacent to the display area DA. The display device 1 may display an image by using light emitted from a plurality of pixels arranged in the display area DA thereof.

The display device 1 includes an opening area OA at least partially surrounded by the display area DA. In an exemplary embodiment, FIG. 1 illustrates that the opening area OA is entirely surrounded by the display area DA. A non-display area NDA may include a first non-display area NDA1 surrounding the opening area OA, and a second non-display area NDA2 surrounding the display area DA. The first non-display area NDA1 may entirely surround the opening area OA, the display area DA may entirely surround the first non-display area NDA1, and the second non-display area NDA2 may entirely surround the display area DA.

Though an organic light-emitting display device is exemplarily described below as the display device 1 according to an exemplary embodiment, the display device is not limited thereto. In another exemplary embodiment, various types of display devices such as an inorganic light-emitting display and a quantum dot light-emitting display may be used.

Figure 2:
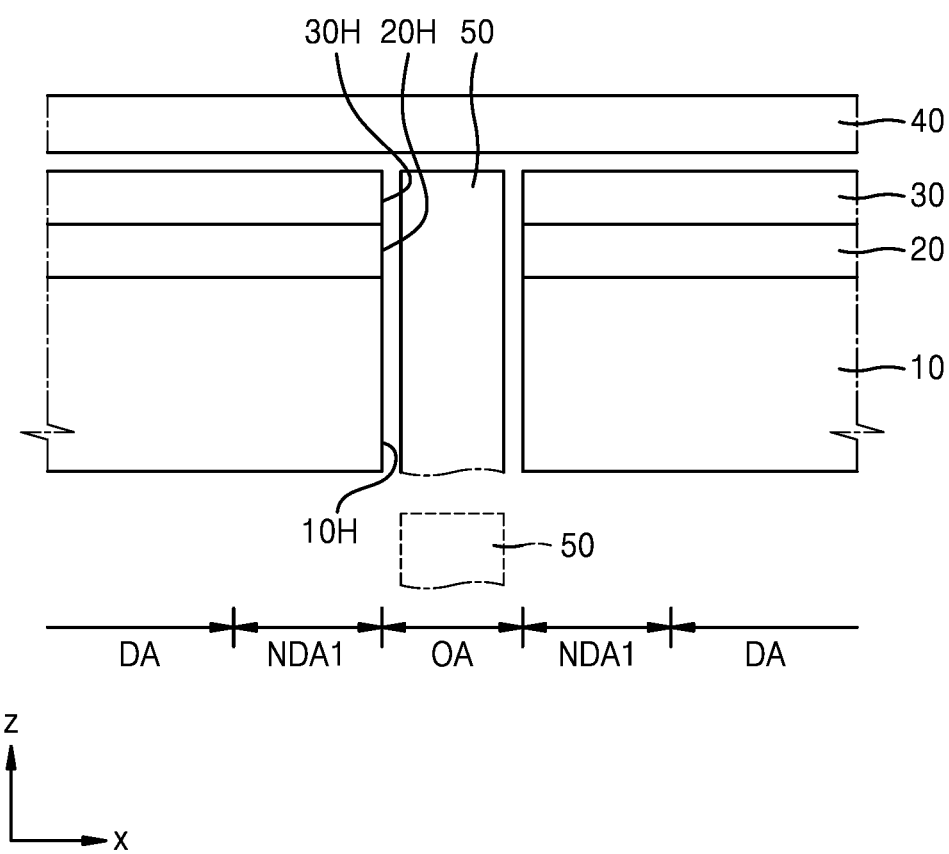
FIG. 2 is a cross-sectional view of a display device according to an exemplary embodiment and may correspond to a cross-section taken along line II-II' of FIG. 1.

FIG. 2 is a cross-sectional view of a display device according to an exemplary embodiment and corresponds to a cross-section taken along line of FIG. 1.

Referring to FIG. 2, the display device 1 may include a display panel 10, an input sensing member 20 and an optical functional member 30 that are disposed on the display panel 10. These members may be covered by a window 40. The display device 1 may include various electronic devices, such as mobile phones, notebook computers, and smartwatches.

The display panel 10 may display an image. The display panel 10 includes pixels arranged in the display area DA. Each of the pixels may include a display element and a pixel circuit connected thereto. The display element may include an organic light-emitting diode, an inorganic light-emitting diode, or a quantum dot light-emitting diode.

The input sensing member 20 obtains coordinate information corresponding to an external input, for example, a touch event. The input sensing member 20 may include a sensing electrode (or a touch electrode) and a trace line connected to the sensing electrode. The input sensing member 20 may be arranged on the display panel 10.

The input sensing member 20 may be directly formed on the display panel 10 or may be formed separately and then coupled by using an adhesive layer such as an optical clear adhesive (OCA). For example, the input sensing member 20 may be successively formed after a process of forming the display panel 10. In this case, the adhesive layer may not be arranged between the input sensing member 20 and the display panel 10. Though FIG. 2 shows that the input sensing member 20 is arranged between the display panel 10 and the optical functional member 30, the input sensing member 20 may be arranged on the optical functional member 30 in another exemplary embodiment.

The optical functional member 30 may include a reflection prevention layer. The reflection prevention layer may reduce reflectivity of light (external light) incident from the outside toward the display panel 10 through the window 40. The reflection prevention layer may include a retarder and a polarizer. The retarder may include a film type retarder or a liquid crystal type retarder. The retarder may include a $\lambda/2$ retarder and/or a $\lambda/4$ retarder. The polarizer may include a film type polarizer or a liquid crystal type polarizer. The film type polarizer may include a stretchable synthetic resin film, and the liquid crystal type polarizer may include liquid crystals arranged in a predetermined arrangement. Each of the retarder and the polarizer may further include a protective film. The retarder and the polarizer themselves or their protective films may be defined as a base layer of the reflection prevention layer.

In another exemplary embodiment, the reflection prevention layer may include a black matrix and color filters. The color filters may be arranged taking into account colors of light emitted respectively from pixels of the display panel 10. In another exemplary embodiment, the reflection prevention layer may include a destructive interference structure. The destructive interference structure may include a first reflection layer and a second reflection layer respectively disposed on different layers. First reflected light and second reflected light respectively reflected by the first reflection layer and the second reflection layer may be destructively interfered and thus reflectivity of external light may be reduced.

The optical functional member 30 may include a lens layer. The lens layer may improve emission efficiency of light emitted from the display panel 10 or reduce color deviation of the light. The lens layer may include a layer having a concave or convex lens shape and/or include a plurality of layers respectively having different refractive indexes. The optical functional member 30 may include both the reflection prevention layer and the lens layer or include one of the reflection prevention layer and the lens layer.

Each of the display panel 10, the input sensing member 20, and the optical functional member 30 may include an opening. With regard to this, it is shown in FIG. 2 that the display panel 10, the input sensing member 20, and the optical functional member 30 respectively include first to third openings 10H, 20H, and 30H and that the first to third openings 10H, 20H, and 30H overlap each other. The first to third openings 10H, 20H, and 30H are located to correspond to the opening area OA. In another exemplary embodiment, at least one of the display panel 10, the input sensing member 20, or/and the optical functional member 30 may not include an opening. For example, one or two of the display panel 10, the input sensing member 20, and the optical functional layer 30 may not include an opening.

A component 50 may correspond to an opening area OA. As shown by a solid line of FIG. 2, the component 50 may be located inside the first to third openings 10H, 20H, and 30H, or as shown by a dashed line, the component 50 may be located below the display panel 10.

The component 50 may include an electronic element. For example, the component 50 may include an electronic element that uses light or sounds. For example, an electronic element may be a sensor, such as an infrared sensor that emits and/or receives light, a camera that receives light and captures an image, a sensor that outputs and senses light or sounds to measure a distance or recognize a fingerprint, a small lamp that outputs light, or a speaker that outputs sounds. An electronic element that uses light may use light in various wavelength bands such as visible light, infrared light, and ultraviolet light. In an exemplary embodiment, the opening area OA may be understood as a transmission area through which light and/or sounds, which are output from the component 50 to the outside or propagate toward the electronic element from the outside, may pass.

In another exemplary embodiment, in the case where the display device 1 is used as a smartwatch or an instrument panel for an automobile, the component 50 may be a member including a needle of a clock or a needle, etc. indicating predetermined information (e.g. the velocity of a vehicle, etc.). In the case where the display device 1 includes a needle of a clock or an instrument panel for an automobile, the component 50 may be exposed to the outside through the window 40, which may include an opening corresponding to the opening area OA.

As described above, the component 50 may include element(s) related to a function of the display panel 10 or an element such as an accessory that increases an esthetic sense of the display panel 10.

Figure 3:
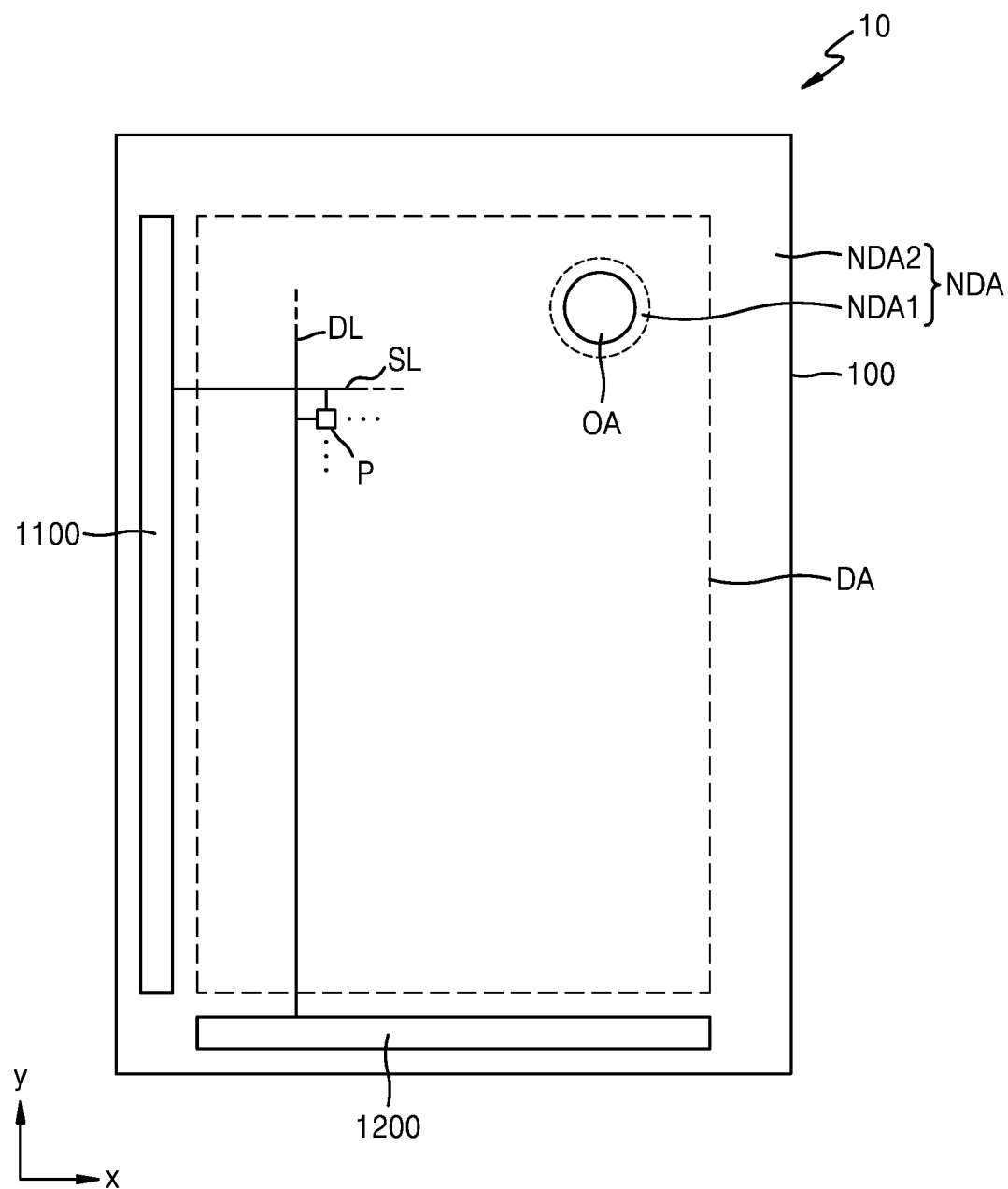
FIG. 3 is a plan view of a display panel according to an exemplary embodiment.
Figure 4:
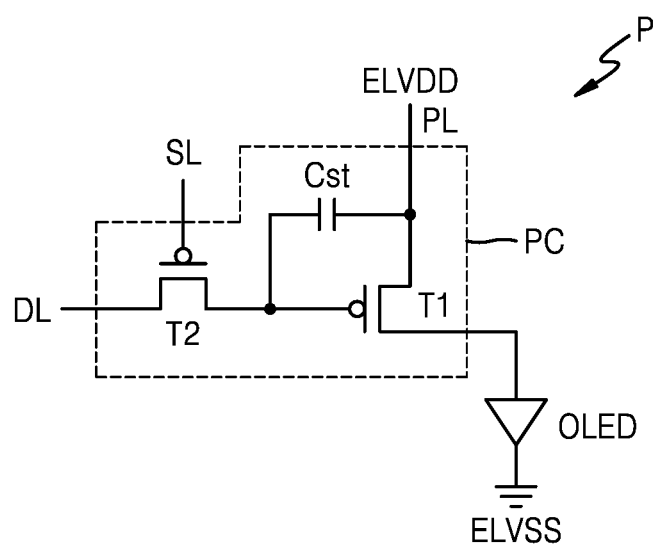
FIG. 4 is an equivalent circuit diagram of one of pixels of a display panel.

FIG. 3 is a plan view of the display panel according to an exemplary embodiment, and FIG. 4 is an equivalent circuit diagram of one of pixels of the display panel 10.

Referring to FIG. 3, the display panel 10 includes the display area DA and the first and second non-display areas NDA1 and NDA2. FIG. 3 may be understood as a representation of a substrate 100 in the display panel 10. For example, the substrate 100 may be understood as having the opening area OA, the first and second non-display areas NDA1 and NDA2.

The display panel 10 includes a plurality of pixels P arranged in the display area DA. As shown in FIG. 4, each pixel P includes a pixel circuit PC and an organic light-emitting diode OLED as a display element connected to the pixel circuit PC. The pixel circuit PC may include a first thin film transistor T1, a second thin film transistor T2, and a storage capacitor Cst. Each pixel P may emit, for example, red, green, blue, or white light through the organic light-emitting diode OLED.

The second thin film transistor T2 includes a switching thin film transistor, may be connected to a scan line SL and a data line DL, and may transfer a data voltage that is input from a data line DL to the first thin film transistor T1 based on a switching voltage input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 includes a driving thin film transistor, may be connected to the driving voltage line PL and the storage capacitor Cst, and may control a driving current flowing through the organic light-emitting diode OLED from the driving voltage line PL based on a voltage value stored in the storage capacitor Cst. The organic light-emitting diode OLED may emit light having predetermined brightness by using the driving current. An opposite electrode (e.g. a cathode) of the organic light-emitting diode OLED may receive a second power voltage ELVSS.

Though it is described with reference to FIG. 4 that the pixel circuit PC includes two thin film transistors and one storage capacitor, the inventive concept is not limited thereto. The number of thin film transistors and the number of storage capacitors may vary depending on a design of the pixel circuit PC.

Referring to FIG. 3 again, the first non-display area NDA1 may surround the opening area OA. The first non-display area NDA1 is an area in which a display element such as an organic light-emitting diode OLED is not arranged. Signal lines that provide a signal to pixels P provided around the opening area OA may pass across the first non-display area NDA1, or groove(s), which will be described below, may be arranged in the first non-display area NDA1. A scan driver 1100 that provides a scan signal to each pixel P, a data driver 1200 that provides a data signal to each pixel P, a main power wiring (not shown) that provides first and second power voltages ELVDD and ELVSS, etc. may be arranged in the second non-display area NDA2. Though it is shown in FIG. 3 that the data driver 1200 is adjacent to one lateral side of the substrate 100, the data driver 1200 may be arranged on a flexible printed circuit board (FPCB) electrically connected to a pad arranged on one side of the display panel 10 according to another exemplary embodiment.

Figure 5:
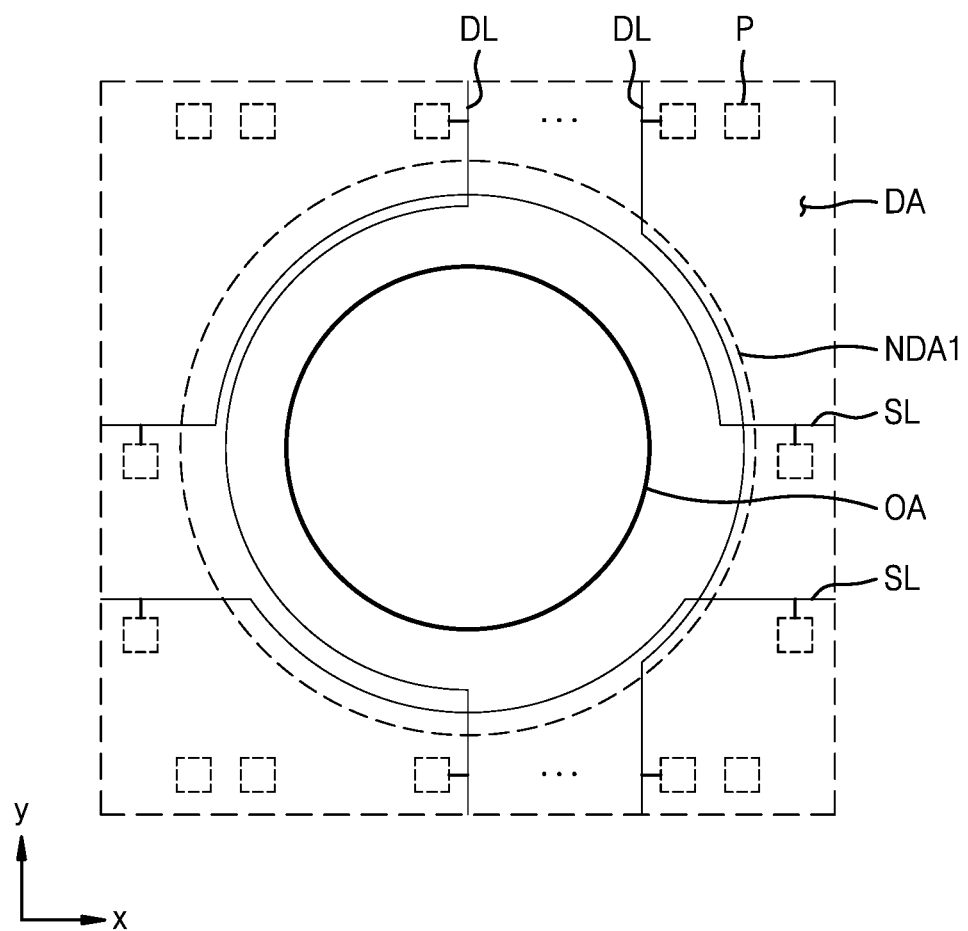
FIG. 5 shows signal lines located in a first non-display area of a display panel according to an exemplary embodiment.

FIG. 5 is a plan view of a portion of the display panel according to an exemplary embodiment and shows signal lines located in the first non-display area NDA1.

Referring to FIG. 5, pixels P may be arranged around the opening area OA in the display area DA, and the first non-display area NDA1 may be located between the opening area OA and the display area DA.

Pixels P may be spaced apart from each other around the opening area OA. The pixels P may be arranged up and down with the opening area OA therebetween or arranged left and right with the opening area OA therebetween.

Signal lines that are adjacent to the opening area OA among signal lines that supply a signal to the pixels P may detour (or bypass) around the opening area OA. Some data lines DL among data lines DL that pass across the display area DA may extend in a y-direction, provide a data signal to the pixels P arranged up and down with the opening area OA therebetween, and detour along an edge of the opening area OA in the first non-display area NDA1. Some scan lines SL among scan lines SL that pass across the display area DA may extend in an x-direction, provide a scan signal to the pixels P arranged left and right with the opening area OA therebetween, and detour along an edge of the opening area OA in the first non-display area NDA1.

Figure 6:
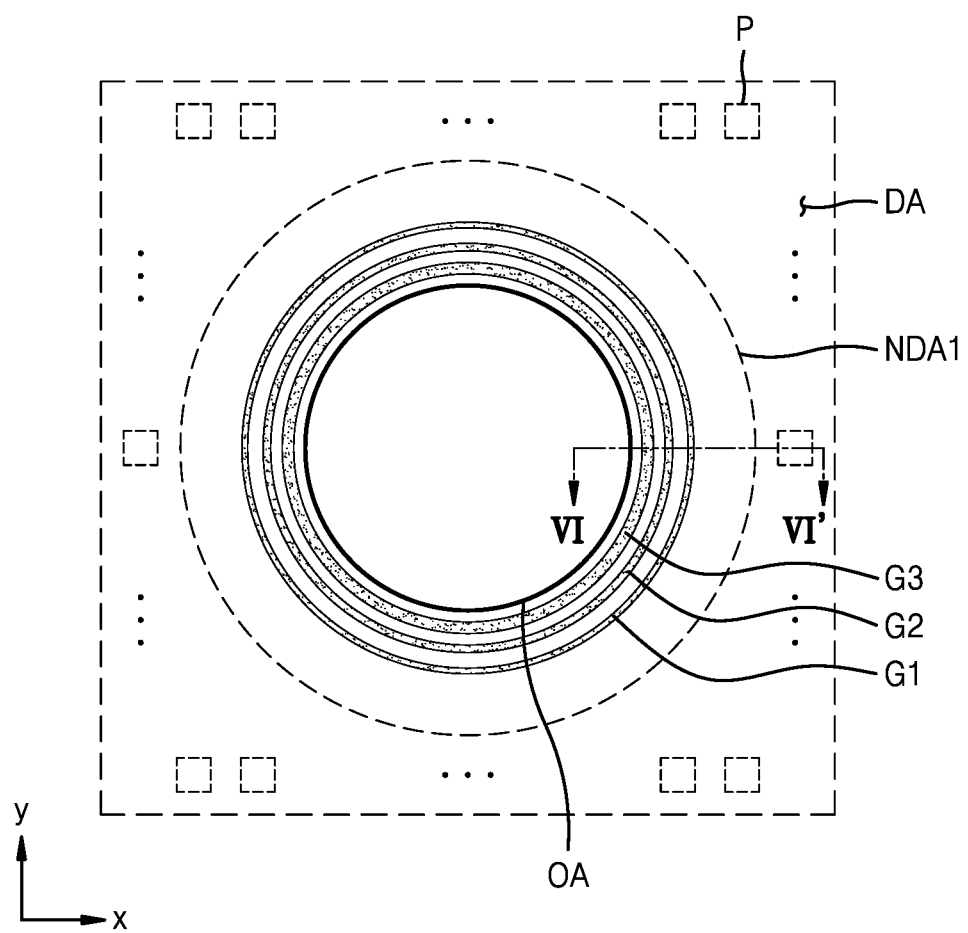
FIG. 6 shows grooves located in a first non-display area of a display panel according to an exemplary embodiment.

FIG. 6 is a plan view of a portion of the display panel according to an exemplary embodiment and shows grooves G located in the first non-display area NDA1.

A plurality of grooves are located between the opening area OA and the display area DA. With regard to this, it is shown in FIG. 6 that first to third grooves G1, G2, and G3 are located between the opening area OA and the display area DA. In another exemplary embodiment, a greater number of grooves than the first to third grooves G1, G2, and G3, for example, four or more grooves, may be arranged in the first non-display area NDA1.

The first to third grooves G1, G2, and G3 may have a ring shape entirely surrounding the opening area OA in the first non-display area NDA1. A diameter of each of the first to third grooves G1, G2, and G3 may be greater than a diameter of the opening area OA, and the first to third grooves G1, G2, and G3 may be spaced apart from each other by a predetermined interval. As shown in FIG. 6, widths of at least two of the first to third grooves G1, G2, and G3 may be different from each other. Referring to FIGS. 5 and 6, the first to third grooves G1, G2, and G3 may be further adjacent to the opening area OA than circuitous portions of data lines and/or scan lines that detour an edge of the opening area OA.

Figure 7:
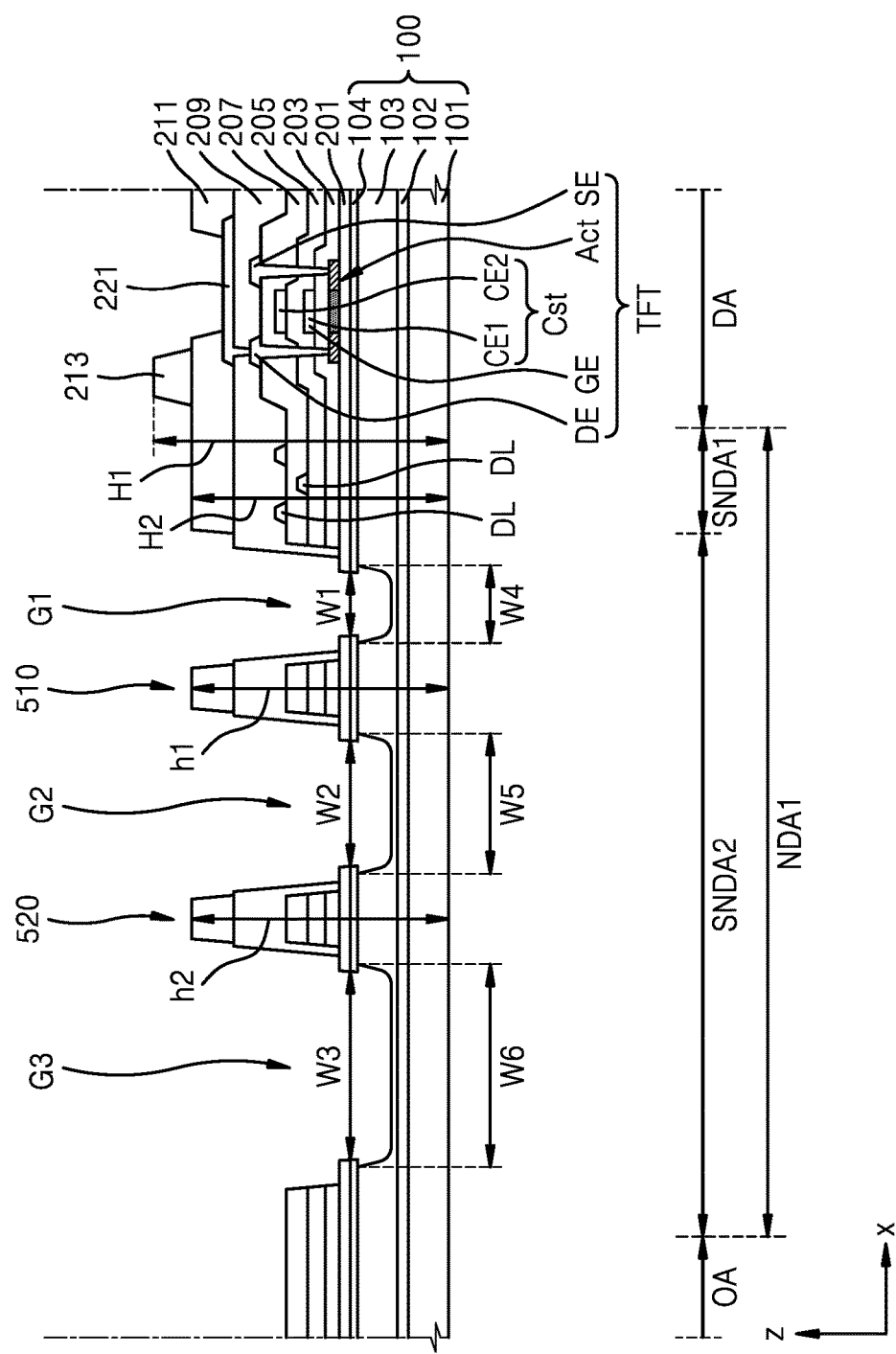
FIG. 7 is a cross-sectional view of a process of manufacturing a display panel according to an exemplary embodiment.
Figure 8A:
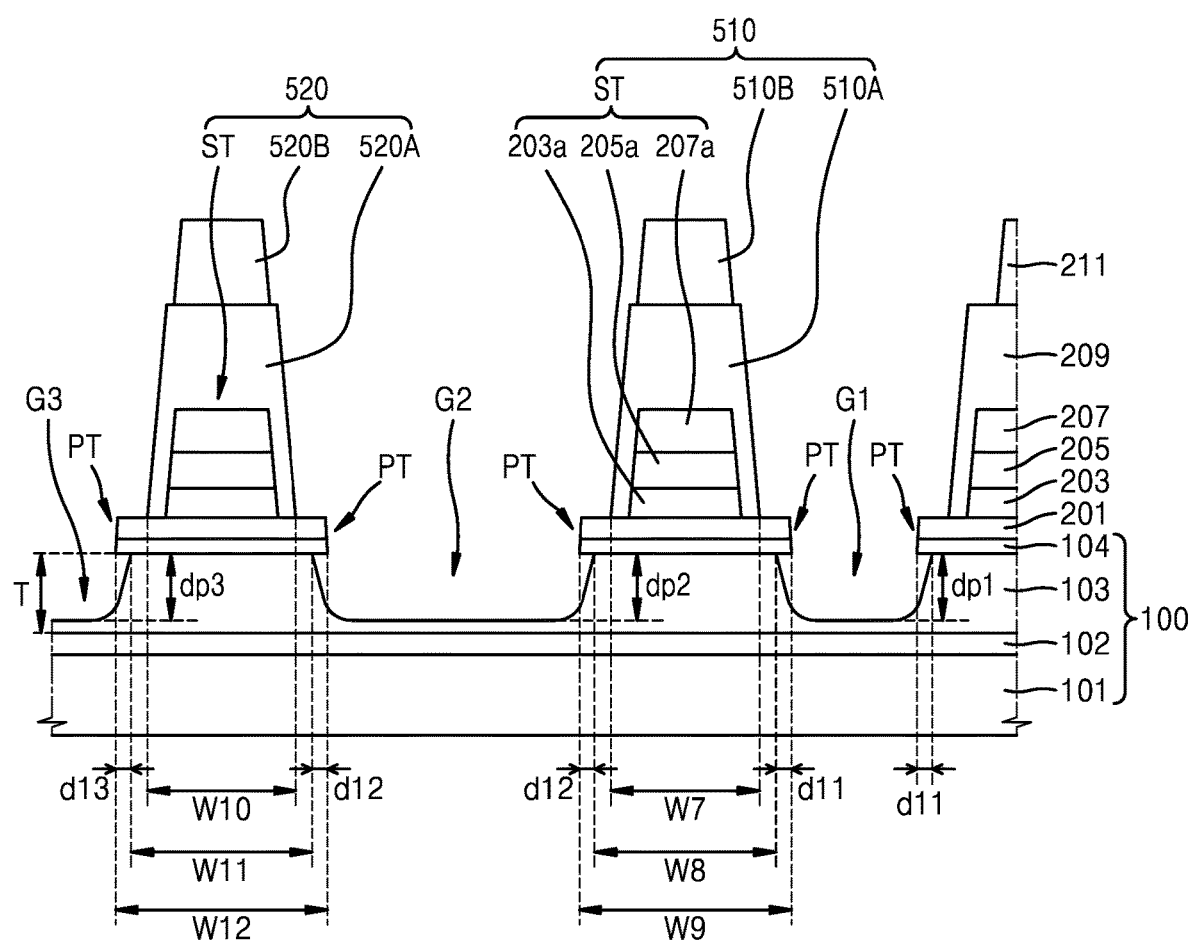
FIG. 8A is an enlarged cross-sectional view of grooves according to an exemplary embodiment.
Figure 8B:
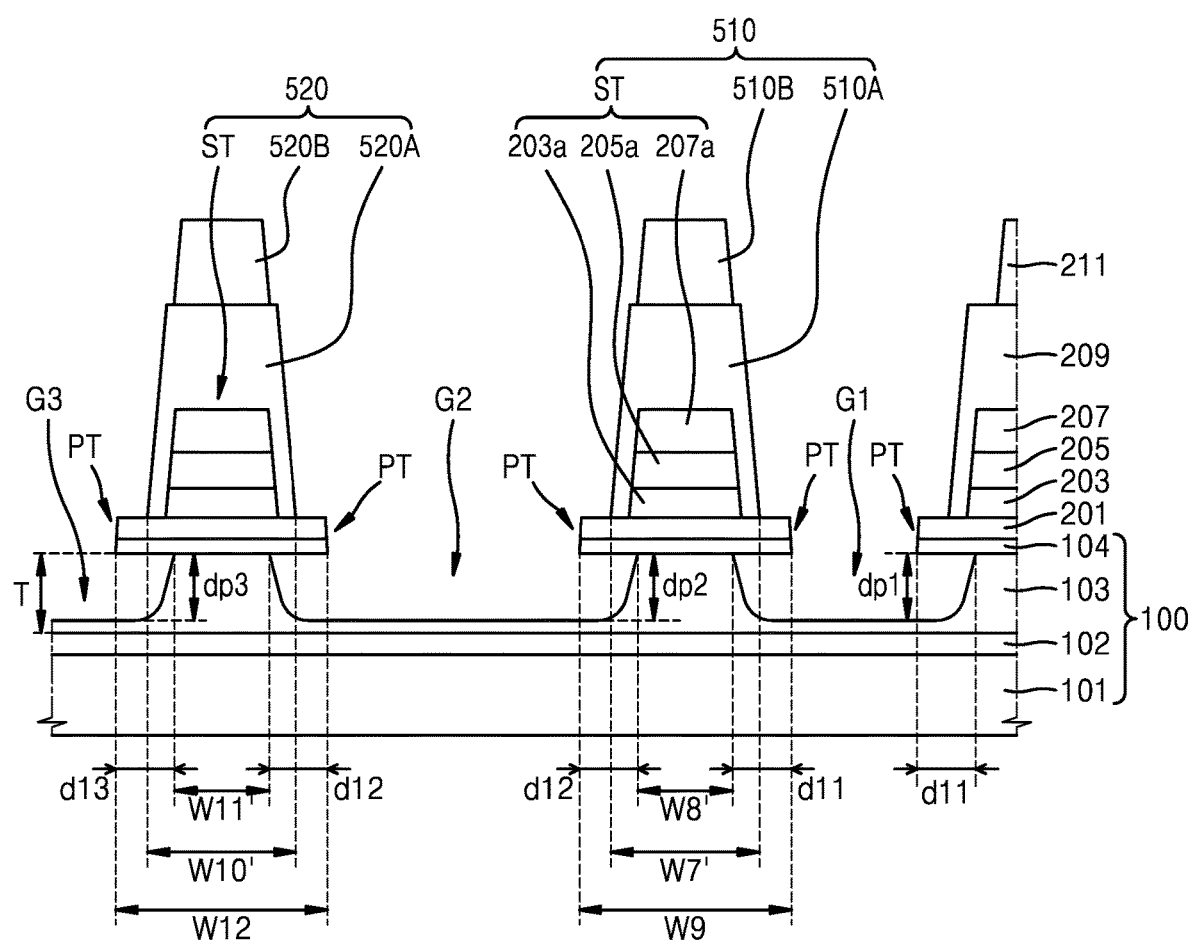
FIG. 8B is an enlarged cross-sectional view of grooves according to another exemplary embodiment.
Figure 8C:
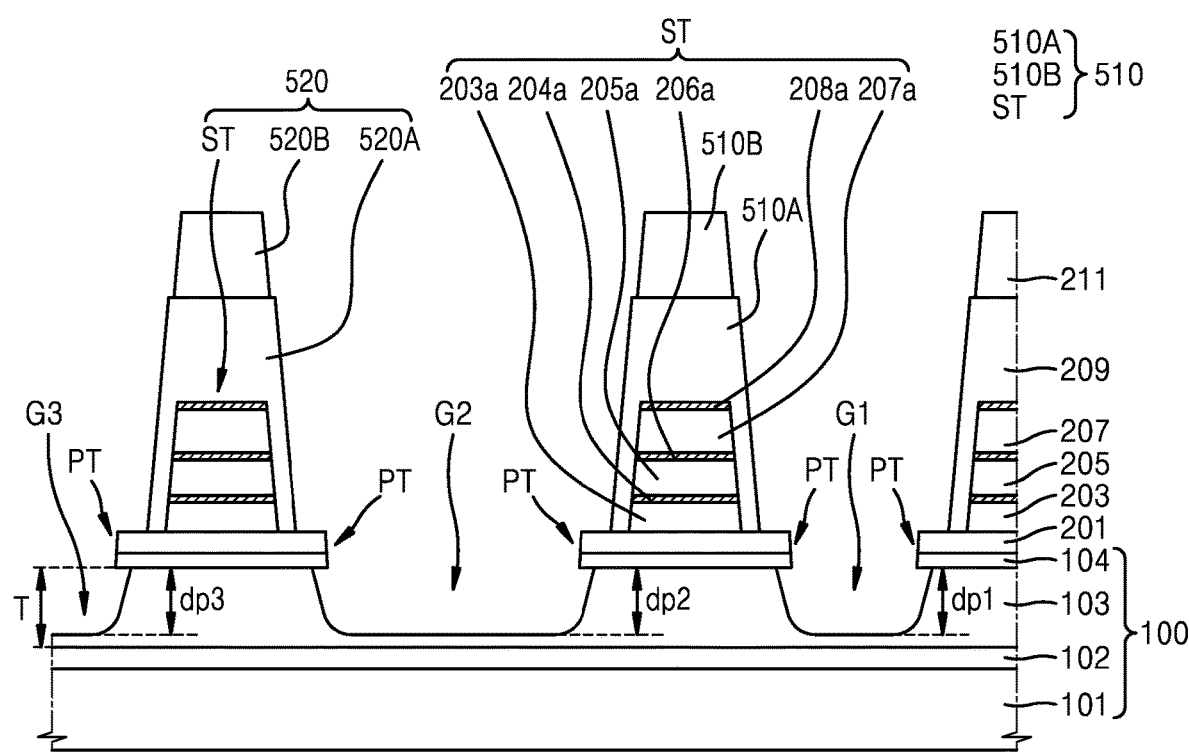
FIG. 8C is an enlarged cross-sectional view of grooves according to another exemplary embodiment.
Figure 8D:
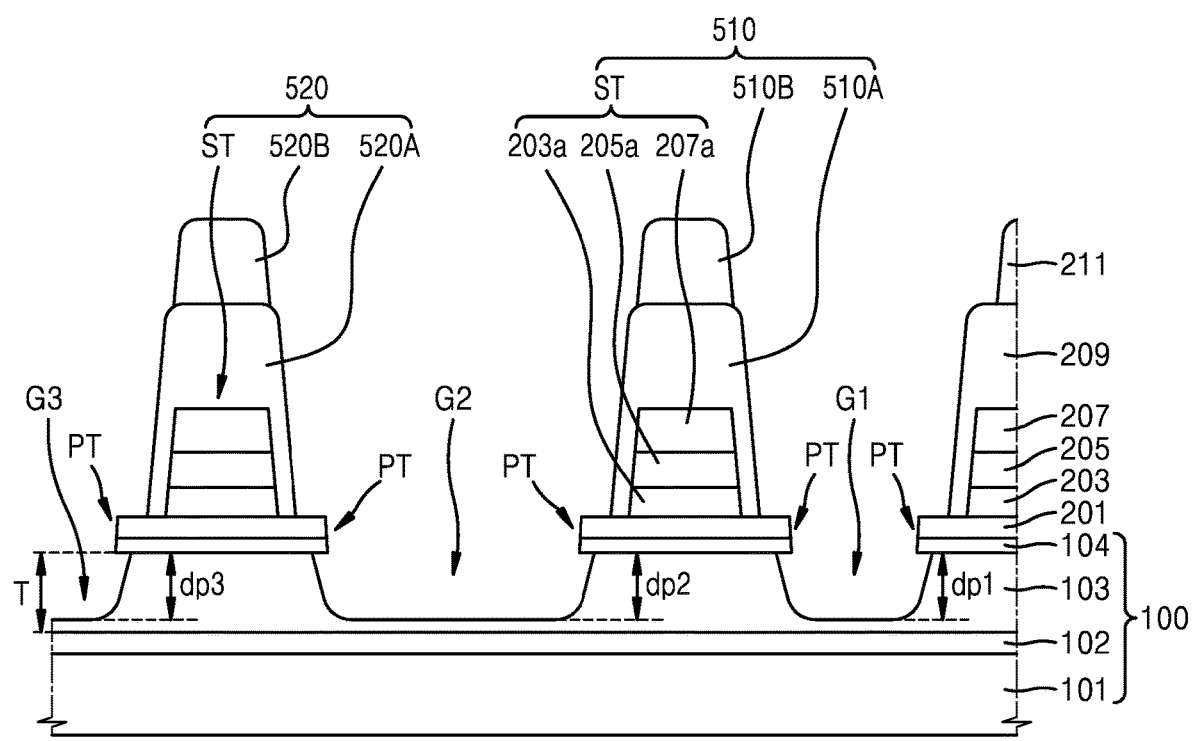
FIG. 8D is an enlarged cross-sectional view of grooves according to another exemplary embodiment.
Figure 8E:
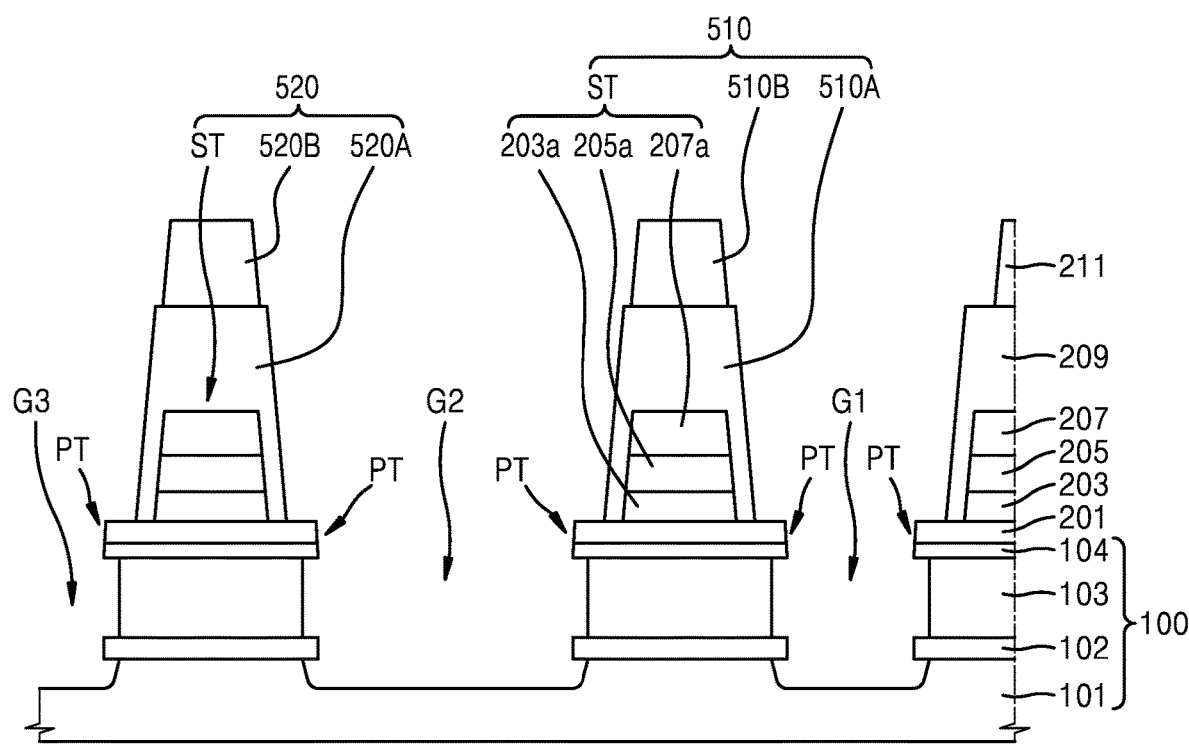
FIG. 8E is an enlarged cross-sectional view of grooves according to another exemplary embodiment.
Figure 9:
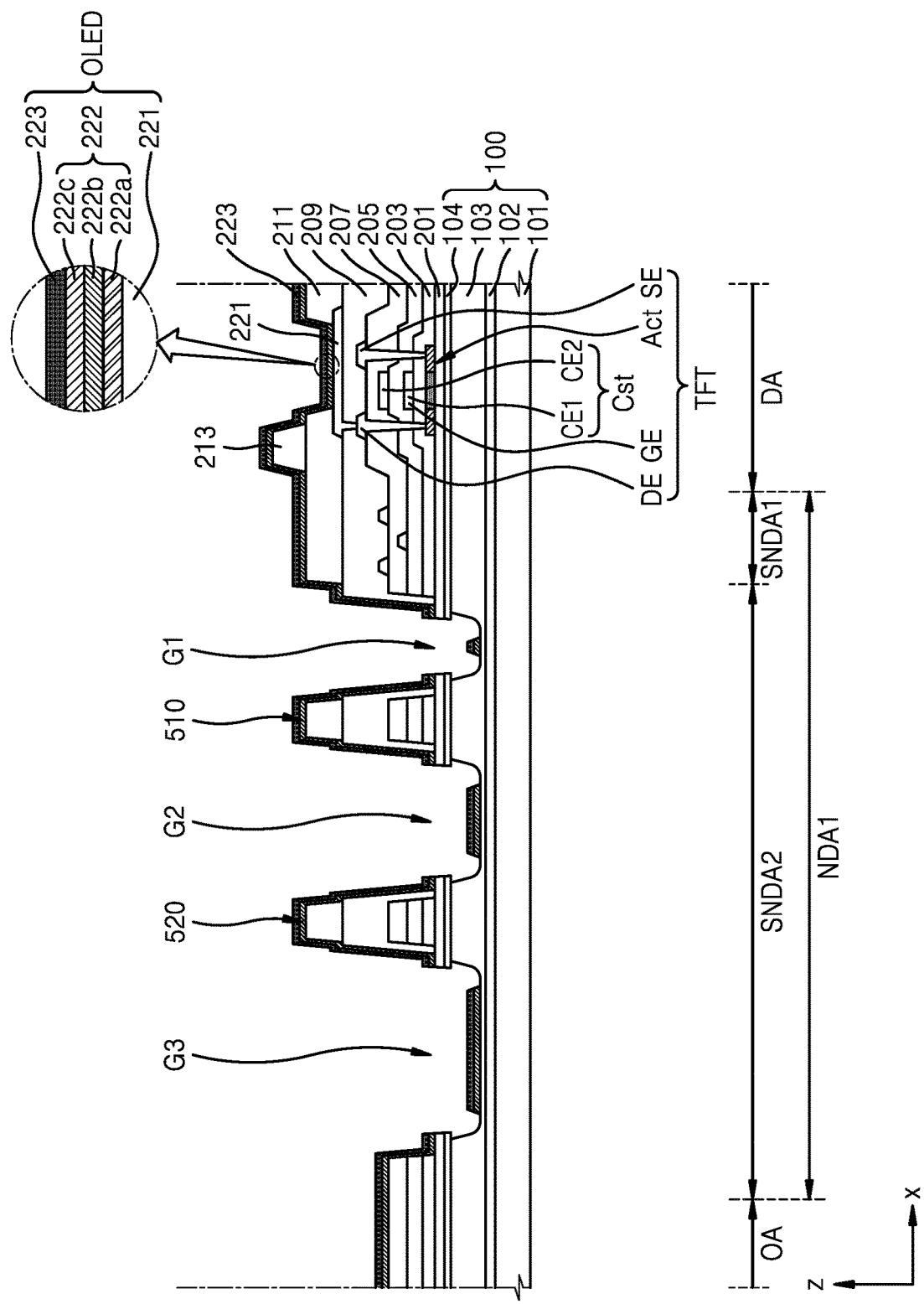
FIG. 9 is a cross-sectional view of a process of manufacturing a display panel according to an exemplary embodiment.
Figure 10:
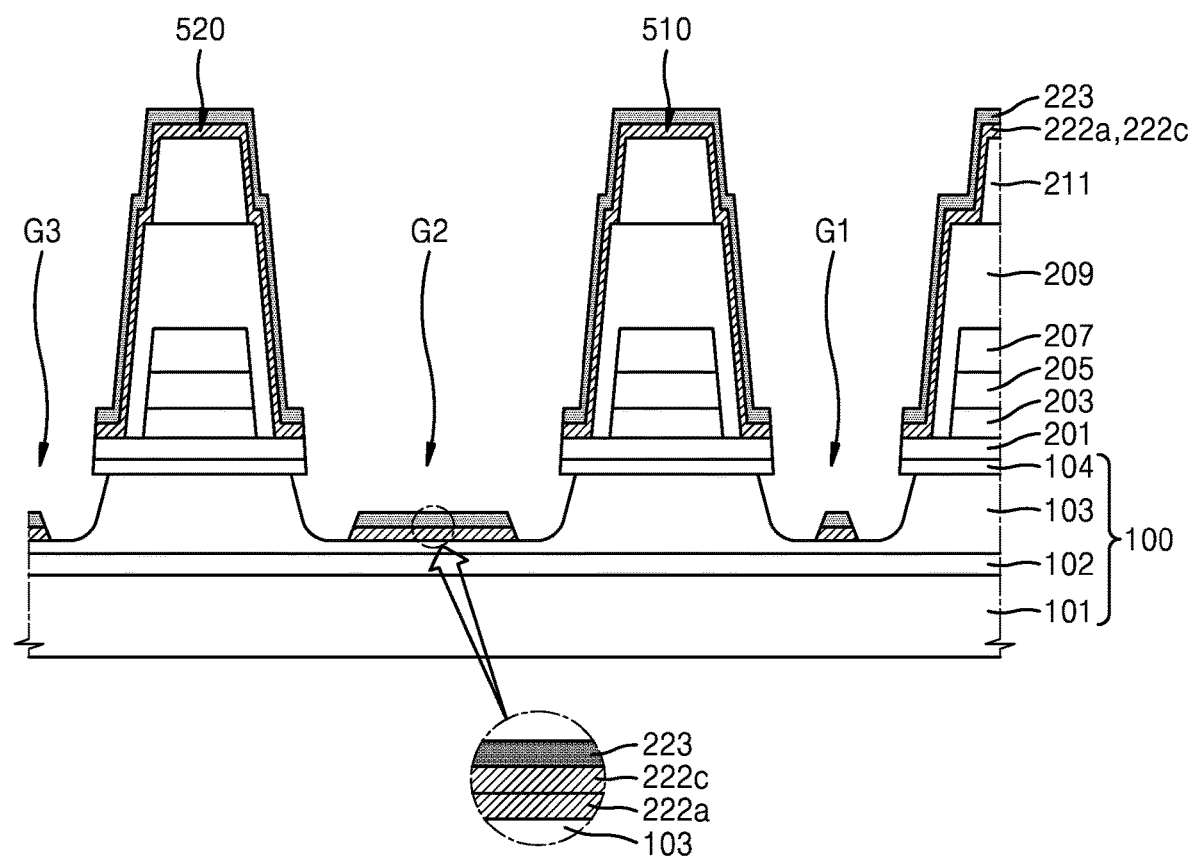
FIG. 10 is an enlarged cross-sectional view of a portion of FIG. 9.

FIGS. 7, 9, 11, and 12 are cross-sectional views of a process of manufacturing a display panel according to an exemplary embodiment, FIG. 8A is an enlarged cross-sectional view of grooves according to an exemplary embodiment and corresponds to a partial enlarged view of FIG. 7, FIGS. 8B to 8E are enlarged cross-sectional views of grooves according to another exemplary embodiment, and FIG. 10 is an enlarged cross-sectional view of a portion of FIG. 9.

First, referring to the display area DA of FIG. 7, a thin film transistor TFT and a storage capacitor Cst, and a pixel electrode 221 electrically connected thereto, are formed over the substrate 100.

The substrate 100 may include a polymer resin. The substrate 100 may include a base layer including a polymer resin and a barrier layer. For example, the substrate 100 may include a first base layer 101, a first barrier layer 102, a second base layer 103, and a second barrier layer 104.

Each of the first and second base layers 101 and 103 may include a polymer resin. For example, the first and second base layers 101 and 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), or cellulose acetate propionate (CAP). The polymer resin may be transparent.

Each of the first and second barrier layers 102 and 104 may be a barrier layer that prevents penetration of external foreign substances and may be a single layer or a multi-layer including an inorganic material such as silicon nitride ($SiN_x$) and/or silicon oxide ($SiO_x$).

A buffer layer 201 configured to prevent impurities from penetrating into a semiconductor layer of a thin film transistor may be arranged on the substrate 100. The buffer layer 201 may include an inorganic insulating material such as silicon nitride or silicon oxide. The buffer layer 201 may be a single layer or a multi-layer including the inorganic insulating material. In an exemplary embodiment, the second barrier layer 104 of the substrate 100 may be understood as a partial-layer of the buffer layer 201 having a multi-layered structure.

The pixel circuit PC including the thin film transistor TFT and the storage capacitor Cst may be arranged on the buffer layer 201. The thin film transistor TFT may include a semiconductor layer Act, a gate electrode GE, a source electrode SE, and a drain electrode DE. The thin film transistor TFT shown in FIG. 7 may correspond to the driving thin film transistor described with reference to FIG. 4. In the present embodiment, though a top-gate type thin film transistor in which the gate electrode GE is arranged over the semiconductor layer Act with a gate insulating layer 203 therebetween is illustrated, according to another exemplary embodiment, the thin film transistor TFT may be a bottom-gate type thin film transistor.

The semiconductor layer Act may include polycrystalline silicon. Alternatively, the semiconductor layer Act may include amorphous silicon or an oxide semiconductor, or an organic semiconductor. The gate electrode GE may include a low-resistance metal material. The gate electrode GE may include a conductive material including molybdenum (Mo), aluminium (Al), copper (Cu), and titanium (Ti) and may include a single layer or a multi-layer including the above-mentioned materials.

The gate insulating layer 203 is arranged between the semiconductor layer Act and the gate electrode GE. The gate insulating layer 203 may include an inorganic insulating material such as silicon oxide, silicon nitride, silicon oxynitride, aluminum oxide, titanium oxide, tantalum oxide, and hafnium oxide. The gate insulating layer 203 may include a single layer or a multi-layer including the above-mentioned materials.

The source electrode SE and the drain electrode DE may include a material having excellent conductivity. The source electrode SE and the drain electrode DE may include a conductive material such as Mo, Al, Cu, and Ti and a compound thereof. The source electrode SE and the drain electrode DE may include a single layer or a multi-layer including the above-mentioned materials. In an exemplary embodiment, the source electrode SE and the drain electrode DE may include a multi-layer including Ti/Al/Ti.

The storage capacitor Cst includes a lower electrode CE1 and an upper electrode CE2 that overlap each other with a first interlayer insulating layer 205 therebetween. The storage capacitor Cst may overlap the thin film transistor TFT. With regard to this, it is shown in FIG. 7 that the gate electrode GE of the thin film transistor TFT serves as the lower electrode CE1 of the storage capacitor Cst. In another exemplary embodiment, the storage capacitor Cst may not overlap the thin film transistor TFT. The storage capacitor Cst may be covered by a second interlayer insulating layer 207.

The first and second interlayer insulating layers 205 and 207 may include an inorganic insulating material, such as silicon oxide, silicon nitride, silicon oxynitride, aluminum oxide, titanium oxide, tantalum oxide, and hafnium oxide. The first and second interlayer insulating layers 205 and 207 may include a single layer or a multi-layer including the above-mentioned materials.

The pixel circuit PC including the thin film transistor TFT and the storage capacitor Cst is covered by a first insulating layer 209. The first insulating layer 209 may be a planarization insulating layer. The first insulating layer 209 may include an organic insulating material including a general-purpose polymer such as, polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an exemplary embodiment, the first insulating layer 209 may include polyimide. Alternatively, the first insulating layer 209 may include an inorganic insulating material or include an inorganic insulating material and an organic insulating material.

The pixel electrode 221 may be formed on the first insulating layer 209. The pixel electrode 221 may include a conductive oxide such indium tin oxide (ITO), zinc oxide (IZO), zinc oxide (ZnO), indium oxide ($In_2O_3$), indium gallium oxide (IGO), or aluminum zinc oxide (AZO). In another exemplary embodiment, the pixel electrode 221 may include a reflective layer including silver (Ag), magnesium (Mg), Al, platinum (Pt), palladium (Pd), gold (Au), nickel (Ni), neodymium (Nd), Iridium (Ir), chromium (Cr), or a compound thereof. In another exemplary embodiment, the pixel electrode 221 may further include a layer including ITO, IZO, ZnO, or $In_2O_3$ on/under the reflective layer.

A second insulating layer 211 may be formed on the pixel electrode 221. The second insulating layer 211 is a pixel-defining layer, includes an opening that exposes a portion of a top surface of the pixel electrode 221, and covers edges of the pixel electrode 221. The second insulating layer 211 may include an organic insulating material. Alternatively, the second insulating layer 211 may include an inorganic insulating material such as silicon nitride, silicon oxynitride, or silicon oxide. Alternatively, the second insulating layer 211 may include an organic insulating material and an inorganic insulating material.

A spacer 213 may be formed on the second insulating layer 211. The spacer 213 may include an organic insulating material, an inorganic insulating material, or an organic insulating material and an inorganic insulating material.

The spacer 213 may include a material different from that of the second insulating layer 211. Alternatively, the spacer 213 may include the same material as that of the second insulating layer 211. In this case, the second insulating layer 211 and the spacer 213 may be simultaneously formed during a mask process that uses a half-tone mask. In an exemplary embodiment, the second insulating layer 211 and the spacer 213 may include polyimide.

Referring to the first non-display area NDA1 of FIG. 7, the first non-display area NDA1 may include a first sub non-display area SNDA1 that is relatively adjacent to the first non-display area NDA1, and a second sub non-display area SNDA2 that is relatively adjacent to the opening area OA.

The first sub non-display area SNDA1 may be an area across which signal lines, for example, the data lines DL shown in FIG. 7, pass. The data lines DL shown in FIG. 7 may correspond to data lines that detour around the opening area OA described with reference to FIG. 5. The first sub non-display area SNDA1 may be a wiring area or a detour (circuitous) area across which the data lines DL pass.

As shown in FIG. 7, the data lines DL may be alternately arranged with an insulating layer therebetween. Alternatively, though not shown, the data lines DL may be arranged on the same insulating layer. In the case where neighboring data lines DL may be respectively arranged under and over an insulating layer (e.g. the second interlayer insulating layer 207), a gap (a pitch) between the adjacent neighboring data lines DL may be reduced and a width of the first non-display area NDA1 may be reduced. Though it is shown in FIG. 7 that the data lines DL are located in the first sub-non-display area SNDA1, the scan lines that detour around the opening area OA described with reference to FIG. 5 may be also located in the first sub-non-display area SNDA1.

The second sub-non-display area SNDA2 may be a kind of groove area in which grooves are arranged. It is shown in FIG. 7 that the first to third grooves G1, G2, and G3 are formed in the second sub non-display area SNDA2.

The first to third grooves G1, G2, and G3 may be formed by patterning a multi-layer including an inorganic layer and an organic layer. For example, the first to third grooves G1, G2, and G3 may be formed by removing a portion of the substrate 100 including a plurality of layers. The first to third grooves G1, G2, and G3 may be formed by removing a portion of the second base layer 103 of the substrate 100 and the second barrier layer 104 on the second base layer 103, etc.

Referring to FIGS. 7 and 8A, the first to third grooves G1, G2, and G3 may be formed by removing portions of the second base layer 103 and the second barrier layer 104. The first to third grooves G1, G2, and G3 may be formed by removing also a portion of the buffer layer 201 on the second barrier layer 104 together with the second barrier layer 104. For example, holes that pass through the second barrier layer 104 and the buffer layer 201, and a recess formed in the second base layer 103 may constitute the first to third grooves G1, G2, and G3.

In an exemplary embodiment, depths dp1, dp2, and dp3 of recesses may be less than a thickness T of the second base layer 103. In this case, a bottom surface of each of the first to third grooves G1, G2, and G3 may be arranged on a virtual plane between a top surface and a bottom surface of the second base layer 103. The a virtual plane may be parallel to the top surface or the bottom surface.

In another exemplary embodiment, the depths dp1, dp2, and dp3 of the recesses formed in the second base layer 103 may be the same as the thickness T of the second base layer 103. In this case, it may be understood that, instead of the recess, a hole that passes through the second base layer 103 is formed in the second base layer 103. The bottom surface of each of the first to third grooves G1, G2, and G3 may be located on the same virtual plane as the bottom surface of the second base layer 103.

The depths dp1, dp2, and dp3 of the recesses or the holes formed in the second base layer 103 may be about 2 µm or more. In the present specification, though the buffer 201 and the second barrier layer 104 have been described as separate elements, the second barrier layer 104 of the substrate 100 may be understood to be a sub-layer of the buffer layer 201 having a multi-layered structure, or the buffer layer 201 may be understood to be a sub-layer of the barrier layer 104 having a multi-layered structure.

The first to third grooves G1, G2, and G3 may be formed by an etching (drying etching or wet etching) process. The etching process of forming the first to third grooves G1, G2, and G3 may be performed separately from a process of forming a contact hole of the thin film transistor TFT located in the display area DA and a process of forming the pixel electrode 221, etc. or may be performed by utilizing the above processes. In another exemplary embodiment, the first to third grooves G1, G2, and G3 may be formed by using laser etching.

Each of the first to third grooves G1, G2, and G3 may have an undercut structure. Each of the first to third grooves G1, G2, and G3 may have an undercut structure in which a width of a portion of each of the first to third grooves G1, G2, and G3 that passes through the second base layer 103 is greater than a width of a portion of each of the first to third grooves G1, G2, and G3 that passes through the insulating layer(s), for example, the second barrier layer 104 and/or the buffer layer 201.

For example, a first width W1 of a portion of the first groove G1 that passes through the second barrier layer 104 and/or the buffer layer 201 may be less than a fourth width W4 of a portion of the first groove G1 that passes through the second base layer 103. In an exemplary embodiment, the first width W1 may be about 6 µm to about 14 µm. A lateral surface of the buffer layer 201 and/or the second barrier layer 104 may protrude further toward the center of the first groove G1 than an inner lateral surface of the second base layer 103. As shown in FIG. 8A, portions of the buffer layer 201 and the second barrier layer 104 that protrude further in a direction parallel to a top surface of the substrate 100 toward the center of the first groove G1 may constitute a pair of eaves (or a pair of protruding tips or tips PT). Each of the tips PT that protrude toward the center of the first groove G1 may protrude further by a first distance d11 than the inner lateral surface of the second base layer 103. The first distance d11 may be about 0.7 µm to about 1.5 µm. In an exemplary embodiment, the first distance d11 may be about 1 µm to about 1.2 µm.

Likewise, a second width W2 of a portion of the second groove G2 that passes through the second barrier layer 104 and/or the buffer layer 201 may be less than a fifth width W5 of a portion of the second groove G2 that passes through the second base layer 103. In an exemplary embodiment, the second width W2 of the second groove G2 may be about 12 µm to about 14 µm. A lateral surface of the buffer layer 201 and/or the second barrier layer 104 may protrude further toward the center of the second groove G2 than the inner laterals surface of the second base layer 103. As shown in FIG. 8A, portions of the buffer layer 201 and the second barrier layer 104 that protrude further in the direction parallel to the top surface of the substrate 100 toward the center of the second groove G2 may constitute a pair of eaves (or a pair of protruding tips or tips PT). Each of the tips PT that protrude toward the center of the second groove G2 may protrude further by a second distance d12 than the inner lateral surface of the second base layer 103. The second distance d12 may be about 0.7 µm to about 1.5 µm. In an exemplary embodiment, the second distance d12 may be about 1 µm to about 1.2 µm.

A third width W3 of a portion of the third groove G3 that passes through the second barrier layer 104 and/or the buffer layer 201 may be less than a sixth width W6 of a portion of the third groove G3 that passes through the second base layer 103. In an exemplary embodiment, the third width W3 of the third groove G3 may be about 18 µm to about 42 µm. A lateral surface of the buffer layer 201 and/or the second barrier layer 104 may protrude further toward the center of the third groove G3 than the inner lateral surface of the second base layer 103. As shown in FIG. 8A, portions of the buffer layer 201 and the second barrier layer 104 that protrude further in the direction parallel to the top surface of the substrate 100 toward the center of the third groove G3 may constitute a pair of eaves (or a pair of protruding tips or tips PT). Each of the tips PT that protrude toward the center of the third groove G3 may protrude further by a third distance d13 than the inner lateral surface of the second base layer 103. The third distance d13 may be about 0.7 µm to about 1.5 µm. In an exemplary embodiment, the third distance d13 may be about 1 µm to about 1.2 µm. The first to third distances d11, d12, and d13 may have the same value or different values.

Widths of the first to third grooves G1, G2, and G3 may be the same or different from each other. With regard to this, it is shown in FIG. 7 that the widths of the first to third grooves G1, G2, and G3 are different from each other. Here, the width of the groove denotes a distance between a tip and a tip facing each other toward the center of the groove. For example, the width (corresponding to W2 of FIG. 7) of the second groove G2 may be greater than the width (corresponding to W1 of FIG. 7) of the first groove G1. The width (corresponding to W3 of FIG. 7) of the third groove G3 may be greater than the width (corresponding to W2 of FIG. 7) of the second groove G2. In an exemplary embodiment, the width W1 of the first groove G1 may be 10 µm, the width W2 of the second groove G2 may be 20 µm, and the width W3 of the third groove G3 may be 30 µm.

A partition wall may be arranged between the plurality of grooves, for example, the first to third grooves G1, G2, and G3. For example, a first partition wall 510 may be located between the first and second grooves G1 and G2, and a second partition wall 520 may be located between the second and third grooves G2 and G3.

Heights h1 and h2 respectively of the first and second partition walls 510 and 520 may be less than a height H1 of the spacer 213. Here, the height h1 of the first partition wall 510 denotes a vertical distance from the substrate 100 to a top surface of the first partition wall 510, and the height h2 of the second partition wall 520 denotes a vertical distance from the substrate 100 to a top surface of the second partition wall 520. Also, the height H1 of the spacer 213 denotes a vertical distance from the substrate 100 to a top surface of the spacer 213. In the present specification, a "height of A" means a vertical distance from the substrate 100 to a top surface of "A", may mean, for example, a vertical distance from a top surface of the substrate 100 to a top surface of "A", or a vertical distance from a bottom surface of the substrate 100 to a top surface of "A". Hereinafter, for convenience of description, description is made to the case where a reference point of a height is the bottom surface of the substrate 100.

In an exemplary embodiment, a difference between the height H1 of the spacer 213 and each of the heights h1 and h2 respectively of the first and second partition walls 510 and 520 may be about 1 µm or more. As a comparative example, when the heights h1 and h2 respectively of the first and second partition walls 510 and 520 is the same as or greater than the height H1 of the spacer 213, the first and second partition walls 510 and 520 may be damaged by a mask used during a process of forming an intermediate layer and an opposite electrode which will be described below with reference to FIG. 9. When the first and second partition walls 510 and 520 are damaged, it may be difficult to control a flow of a monomer during a process of forming an organic encapsulation layer which will be described below, and an inorganic encapsulation layer under the organic encapsulation layer and an inorganic encapsulation layer on the organic encapsulation layer may unexpectedly contact each other and thus the quality of a thin-film encapsulation layer may be deteriorated. However, in the case where the heights h1 and h2 respectively of the first and second partition walls 510 and 520 are formed less than the height H1 of the spacer 213 as in an exemplary embodiment of the invention, the damage inflicted by the above-mentioned mask (e.g. chopping, etc.) and the resulting deterioration in quality of the thin-film encapsulation layer may be prevented.

In an exemplary embodiment, the heights h1 and h2 respectively of the first and second partition walls 510 and 520 may be the same as a height H2 of a top surface of the second insulating layer 211. Here, the height H2 of the top surface of the second insulating layer 211 denotes a vertical distance from the bottom surface of the substrate 100 to the top surface of the first partition wall 510. In another exemplary embodiment, the heights h1 and h2 respectively of the first and second partition walls 510 and 520 may be less than the height H1 of the spacer 213 and greater than the height H2 of the top surface of the second insulating layer 211.

Referring to FIGS. 7 and 8A, each of the first and second partition walls 510 and 520 may include a plurality of insulating layers. In an exemplary embodiment, the first and second partition walls 510 and 520 may respectively include first partition wall layers 510A and 520A and second partition wall layers 510B and 520B. The first partition wall layers 510A and 520A may be formed during the same process as a process of forming the first insulating layer 209 and may include the same material as that of the first insulating layer 209. The second partition wall layers 510B and 520B may be formed during the same process as a process of forming the second insulating layer 211 and may include the same material as that of the second insulating layer 211. In an exemplary embodiment, the first partition wall layers 510A and 520A and the second partition wall layers 510B and 520B may include an organic insulating material. The second partition wall layers 510B and 520B may be respectively formed right on the first partition wall layers 510A and 520A, and bottom surfaces of the second partition wall layers 510B and 520B may respectively directly contact top surfaces, respectively, of the first partition wall layers 510A and 520A located thereunder.

One or more inorganic layers may be arranged in a lower portion of the first partition wall layers 510A and 520A. With regard to this, FIGS. 7 and 8A show that first to third sub-layers 203a, 205a, and 207a are arranged in the lower portion of the first partition wall layers 510A and 520A. The first sub-layer 203a may be formed during the same process as a process of forming the gate insulating layer 203 and may include the same material as that of the gate insulating layer 203. The second sub-layer 205a may be formed during the same process as a process of forming the first interlayer insulating layer 205 and may include the same material as that of the first interlayer insulating layer 205. The third sub-layer 207a may be formed during the same process as a process of forming the second interlayer insulating layer 207 and may include the same material as that of the second interlayer insulating layer 207.

The above-described one or more inorganic layers (referred to as inorganic structures ST, hereinafter) may be covered by the first partition wall layers 510A and 520A. For example, the first partition wall layers 510A and 520A may cover all of top surfaces and lateral surfaces of the inorganic structures ST provided thereunder and thus, the inorganic structures ST may not be exposed to the outside.

Referring to the first partition wall 510 of FIG. 8A, the first partition wall 510 may be located between the first and second grooves G1 and G2, and a seventh width W7 of a bottom surface of the first partition wall 510 may be less than a ninth width W9 between the first and second grooves G1 and G2 that are adjacent to the first partition wall 510. In other words, a horizontal distance (corresponds to W9) between an end of a tip PT of the first groove G1 and an end of a tip PT of the second groove G2 is greater than the seventh width W7 of the bottom surface of the first partition wall 510.

Since each of the first and second grooves G1 and G2 has an undercut structure, the ninth width W9 between the first and second grooves G1 and G2 is greater than an eighth width W8, which is a minimum horizontal distance between an inner surface of the second base layer 103 that constitutes the first groove G1 and an inner surface of the second base layer 103 that constitutes the second groove G2.

As shown in FIG. 8A, the eighth width W8 may be greater than the seventh width W7. Alternatively, as shown in FIG. 8B, an eighth width W8' may be less than a seventh width W7'. In the exemplary embodiment shown in FIG. 8B, the eighth width W8' and the seventh width W7' are less than the ninth width W9, which is the same as the exemplary embodiment shown above in FIG. 8A.

The relations between the seventh to ninth widths W7, W7', W8, W8', and W9 around the first partition wall 510 described with reference to FIGS. 8A and 8B are equally applicable to the second partition wall 520.

For example, as shown in FIG. 8A, a tenth width W10 of a bottom surface of the second partition wall 520 may be less than a twelfth width W12 between the second and third grooves G2 and G3. The twelfth width W12 between the second and third grooves G2 and G3 corresponds to a horizontal distance between an end of a left tip PT of the second groove G2 and an end of a right tip PT of the third groove G3. Since each of the second and third grooves G2 and G3 has an undercut structure, the twelfth width W12 between the second and third grooves G2 and G3 is greater than an eleventh width W11, which is a minimum horizontal distance between an inner surface of the second base layer 103 that constitutes the second groove G2 and an inner surface of the second base layer 103 that constitutes the third groove G3.

As shown in FIG. 8A, the eleventh width W11 may be greater than the tenth width W10. Alternatively, as shown in FIG. 8B, an eleventh width W11' may be less than a tenth width W10'. In the embodiment shown in FIG. 8B, the eleventh width W11' and the tenth width W10' are less than the twelfth width W12.

As shown in FIGS. 7 and 8A, the heights h1 and h2 respectively of the first and second partition walls 510 and 520 may be adjusted by the inorganic structures ST and the first and second partition wall layers 510A, 510B, 520A, and 520B. In other words, thicknesses of the layers that constitute the inorganic structures ST and the first and second partition wall layers 510A, 510B, 520A, and 520B may influence the heights h1 and h2 respectively of the first and second partition walls 510 and 520.

Though it is shown in FIGS. 8A and 8B that the heights h1 and h2, respectively, of the first and second partition walls 510 and 520 are based on thicknesses of the first to third sub-layers 203a, 205a, and 207a and the thicknesses of the first and second partition wall layers 510A, 510B, 520A, and 520B, the inventive concept is not limited thereto. In another exemplary embodiment, one or more of the first sub-layer 203a, the second sub-layer 205a, the third sub-layer 207a, the first partition wall layer 510A, and the second partition wall layer 510B may be omitted, and remaining layers may determine the height h1 of the first partition wall 510. Likewise, the height h2 of the second partition wall 520 may be determined by layers selected from the first sub-layer 203a, the second sub-layer 205a, the third sub-layer 207a, the first partition wall layer 520A, and the second partition wall layer 520B. That is, one or more of the first sub-layer 203a, the second sub-layer 205a, the third sub-layer 207a, the first partition wall layer 520A, and the second partition wall layer 520B that correspond to the second partition wall 520 may be omitted, and remaining layers may determine the height h2 of the second partition wall 520. The height h1 of the first partition wall 510 and the height h2 of the second partition wall 520 may be the same or different from each other.

Though it is shown in FIGS. 8A and 8B that the first to third sub-layers 203a, 205a, and 207a included in the inorganic structure ST include inorganic insulating layers, the inventive concept is not limited thereto. In another exemplary embodiment, the inorganic structure ST may include a metal layer.

Referring to FIG. 8C, the inorganic structure ST may include the first to third sub-layers 203a, 205a, and 207a, and first to third metal layers 204a, 206a, and 208a. For example, the first metal layer 204a may include the same material as that of the gate electrode or the lower electrode of the storage capacitor shown in FIG. 7. The second metal layer 206a may include the same material as that of the upper electrode of the storage capacitor shown in FIG. 7. The third metal layer 208a may include the same material as that of the source electrode or the drain electrode or the data line shown in FIG. 7.

At least one of the plurality of layers that constitute the inorganic structure ST shown in FIG. 8C may be omitted and remaining layers may influence the heights h1 and h2 respectively of the first and second partition walls 510 and 520 depending on an exemplary embodiment. For example, one or more of the first sub-layer 203a, the first metal layer 204a, the second sub-layer 205a, the second metal layer 206a, the third sub-layer 207a, the third metal layer 208a, the first partition wall layer 510A, and the second partition wall layer 510B may be omitted, and remaining layers may determine the height h1 of the first partition wall 510. Likewise, the height h2 of the second partition wall 520 may be determined by omitting one or more of layers from the first sub-layer 203a to the second partition wall layer 520B. The inorganic structure ST described with reference to FIG. 8C is equally applicable to the inorganic structure according to the exemplary embodiment shown in FIG. 8B and an exemplary embodiment which will be described below.

Though it is shown in FIGS. 8A to 8C that a lateral surface of each of the first and second partition wall layers 510A, 510B, 520A and 520B is a forward tapered surface and has an approximately trapezoidal cross-section on the whole, the inventive concept is not limited thereto. In another exemplary embodiment, a corner portion at which a lateral surface and a top surface of each of the first and second partition wall layers 510A, 510B, 520A and 520B meet may have a rounded shape.

Referring to FIG. 8D, a lateral surface of the first partition wall layer 510A corresponding to the first partition wall 510 may have a forward tapered surface, a central portion of a top surface of the first partition wall layer 510A may include a flat surface, and a corner portion at which the lateral surface and the top surface meet may have a rounded shape, that is, a curved surface. Likewise, a corner portion at which a lateral surface and a top surface of the second partition wall layer 510B corresponding to the first partition wall 510 meet may also have a rounded shape. A lateral surface of the second partition wall layer 510B of the first partition wall 510 may have a forward tapered shape, and a central portion of the top surface of the second partition wall layer 510B may include a flat surface. In another exemplary embodiment, not only edges but also central portions of the top surfaces of the first and second partition wall layers 510A and 510B corresponding to the first partition wall 510 may have a convex curved surface on the whole.

Likewise, a lateral surface of the first partition wall layer 520A corresponding to the second partition wall 520 may have a forward tapered surface, a central portion of a top surface of the first partition wall layer 520A may include a flat surface, and a corner portion at which the lateral surface and the top surface meet may have a rounded shape, that is, a curved surface. Likewise, a corner portion at which a lateral surface and a top surface of the second partition wall layer 520B corresponding to the second partition wall 520 meet may also have a rounded shape. The lateral surface of the second partition wall layer 520B may have a forward tapered surface, and the central portion of the top surface of the second partition wall layer 520B may include a flat surface. In another exemplary embodiment, not only edges but also central portions of the top surfaces of the first and second partition wall layers 520A and 520B corresponding to the second partition wall 520 may have a convex curved surface on the whole.

As described above, the first insulating layer 209 may be formed during the same process as a process of forming the first partition wall layers 510A and 520A, and thus, a corner portion at which a lateral surface and a top surface of the first insulating layer 209 meet may also have a rounded shape. Similarly, a corner portion at which a lateral surface and a top surface of the second insulating layer 211 meet may have a rounded shape.

Though it is shown in FIGS. 8A and 8D that a bottom surface of each of the first to third grooves G1, G2, and G3 is arranged between a top surface and a bottom surface of the second base layer 103, the inventive concept is not limited thereto. Alternatively, as mentioned above, the bottom surface of each of the first to third grooves G1, G2, and G3 may be arranged on a virtual surface which is the same as the bottom surface of the second base layer 103 and a top surface of the first barrier layer 102. In another exemplary embodiment, as shown in FIG. 8E, the first to third grooves G1, G2, and G3 may be formed by removing a portion of the second barrier layer 104, the second base layer 103, the first barrier layer 102, and the first base layer 101.

Referring to FIG. 8E, the bottom surface of each of the first to third grooves G1, G2, and G3 may be arranged on a virtual plane between a top surface and a bottom surface of the first base layer 101. As shown in FIG. 8E, a thickness of the first base layer 101 may be the same as or greater than a thickness of the second base layer 103.

Each of the first to third grooves G1, G2, and G3 may have a plurality of undercut structures in a depth direction (or a thickness direction of the substrate). For example, the first base layer 101 and the first barrier layer 102, each corresponding to the first groove G1 may have an undercut structure, and the second base layer 103 and the second barrier layer 104, each corresponding to the first groove G1 may have an undercut structure. That is, it may be understood that the first groove G1 has a plurality of overlapping undercut structures. Likewise, each of the second groove G2 and the third groove G3 may have a plurality of overlapping undercut structures. The structure of FIG. 8E is applicable to the embodiment described with reference to FIGS. 8A to 8D and exemplary embodiments derived therefrom. Hereinafter, for convenience of description, the structure of FIG. 8A is mainly described.

Referring to FIG. 9, an intermediate layer 222 and an opposite electrode 223 are formed over the substrate 100 over which the first to third grooves G1, G2, and G3 have been formed. Each of the intermediate layer 222 and the opposite electrode 223 may be formed by using a mask and formed by thermal evaporation, etc.

Referring to an enlarged view of FIG. 9, the intermediate layer 222 includes an emission layer 222b. The intermediate layer 222 may include a first functional layer 222a under the emission layer 222b and/or a second functional layer 222c on the emission layer 222b. The emission layer 222b may include a polymer and/or low molecular organic material that emits light of a predetermined color.

The first functional layer 222a may include a single layer or a multi-layer. For example, in the case where the first functional layer 222a includes a polymer material, the first functional layer 222a is a hole transport layer (HTL), which has a single-layered structure, and may include poly-(3,4)-ethylene-dihydroxy thiophene (PEDOT) or polyaniline (PANT). In the case where the first functional layer 222a includes a low molecular material, the first functional layer 222a may include a hole injection layer (HIL) and an HTL.

The second functional layer 222c is not always provided. For example, in the case where the first functional layer 222a and the emission layer 222b include a polymer material, it is preferable that the second functional layer 222c is provided. The second functional layer 222c may include an electron transport layer (ETL) and/or an electron injection layer (EIL).

The emission layer 222b of the intermediate layer 222 may be arranged every pixel in the display area DA. For example, the emission layer 222b may overlap a portion of a top surface of the pixel electrode 221 that is exposed through the opening of the second insulating layer 211. Each of the first and second functional layers 222a and 222c of the intermediate layer 222 may be provided as one body so as to cover not only the display area DA but also the first non-display area NDA1.

An opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or $In_2O_3$ on the (semi) transparent layer including the above-mentioned material. The opposite electrode 223 may be provided as one body so as to cover not only the display area DA but also the first non-display area NDA1.

Referring to FIGS. 9 and 10, the first and second functional layers 222a and 222c and the opposite electrode 223 are formed in the first non-display area NDA1 and may be disconnected by the first to third grooves G1, G2, and G3. The first and second functional layers 222a and 222c and the opposite electrode 223 may be disconnected by the undercut structures of the first to third grooves G1, G2, and G3.

A layer including an organic material among layers over the substrate 100 may serve as a path through which foreign substances, for example, moisture may propagate. Since the first and second functional layers 222a and 222c include an organic material, the first and second functional layers 222a and 222c may serve as an above-mentioned moisture transmission path, however, since the first and second functional layers 222a and 222c are disconnected by the first to third grooves G1, G2, and G3, propagation of moisture in a lateral direction (an x-direction) may be prevented, and damage of an organic light-emitting diode OLED, including the pixel electrode 221, the intermediate layer 222, and the opposite electrode 223, may be prevented.

Figure 11:
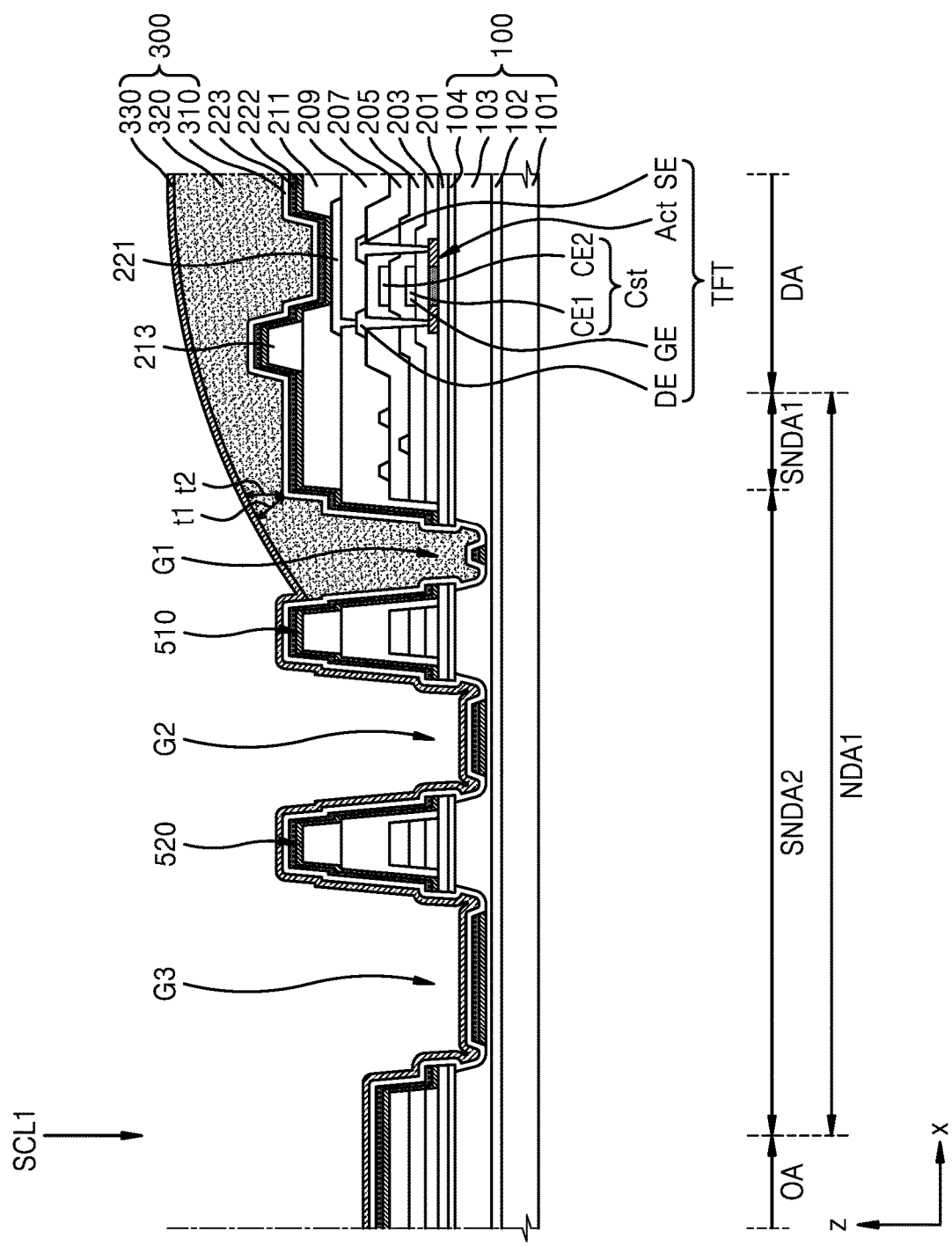
FIG. 11 is a cross-sectional view of a process of manufacturing a display panel according to an exemplary embodiment.

Referring to FIG. 11, a thin-film encapsulation layer 300 is formed. The thin-film encapsulation layer 300 may prevent an organic light-emitting diode from being damaged or subject to deterioration by external impurities by covering the organic light-emitting diode of the display area DA.

The thin-film encapsulation layer 300 may include at least one organic encapsulation layer and at least one inorganic encapsulation layer. It is shown in FIG. 11 that the thin-film encapsulation layer 300 includes first and second inorganic encapsulation layers 310 and 330, and an organic encapsulation layer 320 therebetween. In another exemplary embodiment, the number of organic encapsulation layers, the number of inorganic encapsulation layers, and a stacking sequence thereof may change.

The first inorganic encapsulation layer 310 may include at least one inorganic insulating material, such as aluminum oxide, titanium oxide, tantalum oxide, hafnium oxide, zinc oxide, silicon oxide, silicon nitride, and silicon oxynitride. The first inorganic encapsulation layer 310 may be formed by a chemical vapor deposition (CVD) process.

Unlike the first and second functional layers 222a and 222c and the opposite electrode 223 described with reference to FIG. 9, since the first inorganic encapsulation layer 310 has a relatively excellent step coverage, the first inorganic encapsulation layer 310 may be continuously formed without disconnection.

As shown in FIG. 11, the first inorganic encapsulation layer 310 may entirely cover inner surfaces of the first to third grooves G1, G2, and G3. Lateral surfaces and bottom surfaces of the buffer layer 201 and the second barrier layer 104 and an inner surface and a bottom surface of the second base layer 103 may be covered by the first inorganic encapsulation layer 310. The first inorganic encapsulation layer 310 may also cover the first and second functional layers 222a and 222c and the opposite electrode 223 that are disconnected and arranged on a bottom surface of each of the first to third grooves G1, G2, and G3.

The organic encapsulation layer 320 may include a polymer-based material. The polymer-based material may include an acrylic-based resin, an epoxy-based resin, polyimide, and polyethylene.

The organic encapsulation layer 320 may be formed by coating a monomer over the substrate 100 and hardening the same. The first and/or second partition walls 510 and 520 may control a flow of the monomer and adjust a thickness of the monomer, that is, a thickness of the organic encapsulation layer 320. When the thickness of the organic encapsulation layer 320 is a minimum thickness or less, the organic encapsulation layer 320 cannot sufficiently cover stress and impurities (particles, etc.) occurring from a structure under the organic encapsulation layer 320 or during a manufacturing process, and a layer(s) on or under the organic encapsulation layer 320 may be exfoliated or a black point may occur. The first and/or second partition walls 510 and 520 may secure a thickness of the organic encapsulation layer 320 by controlling a flow of the monomer and thus the above-described problems may be prevented. With regard to this, it is shown in FIG. 11 that a flow of the monomer is controlled by the first partition wall 510 and the thickness of the organic encapsulation layer 320 is secured.

The organic encapsulation layer 320 may have a relatively flat top surface in the display area DA and have a relatively smooth top surface corresponding to a curved surface around the first or second partition wall 510 or 520, that is, in the first non-display area NDA1. Since the organic encapsulation layer 320 covers concave or convex structures of layers thereunder, the organic encapsulation layer 320 may have different thicknesses depending on a location thereof.

The thickness of the organic encapsulation layer 320 may be in a range from about 1 μm to about 8 μm. In an exemplary embodiment, the thickness of the organic encapsulation layer 320 may be, for example, in a range from about 1 μm to about 4 μm. For example, a minimum thickness t1 at a point between a top surface and a lateral surface of the second insulating layer 211 of the organic encapsulation layer 320 may be about 1 μm, and a thickness of the relevant point in a vertical direction (a z-direction) may have a value greater than 1 μm.

The second inorganic encapsulation layer 330 may include at least one inorganic insulating material such as aluminum oxide, titanium oxide, tantalum oxide, hafnium oxide, zinc oxide, silicon oxide, silicon nitride, and silicon oxynitride, and may be formed by a CVD process.

Like the first inorganic encapsulation layer 310, the second inorganic encapsulation layer 330 may entirely cover the substrate 100. A portion of the second inorganic encapsulation layer 330 may directly contact the first inorganic encapsulation layer 310 in the second sub non-display area SNDA2. A space of the first groove G1 that is over the first inorganic encapsulation layer 310 is at least partially filled with the organic encapsulation layer 320. In contrast, there is no organic encapsulation layer 320 in the second and third grooves G2 and G3. Therefore, the second inorganic encapsulation layer 330 may directly contact the first inorganic encapsulation layer 310 in the second and third grooves G2 and G3. The first and second inorganic encapsulation layers 310 and 330 may contact each other also on top surfaces of the first and second partition walls 510 and 520.

Figure 12:
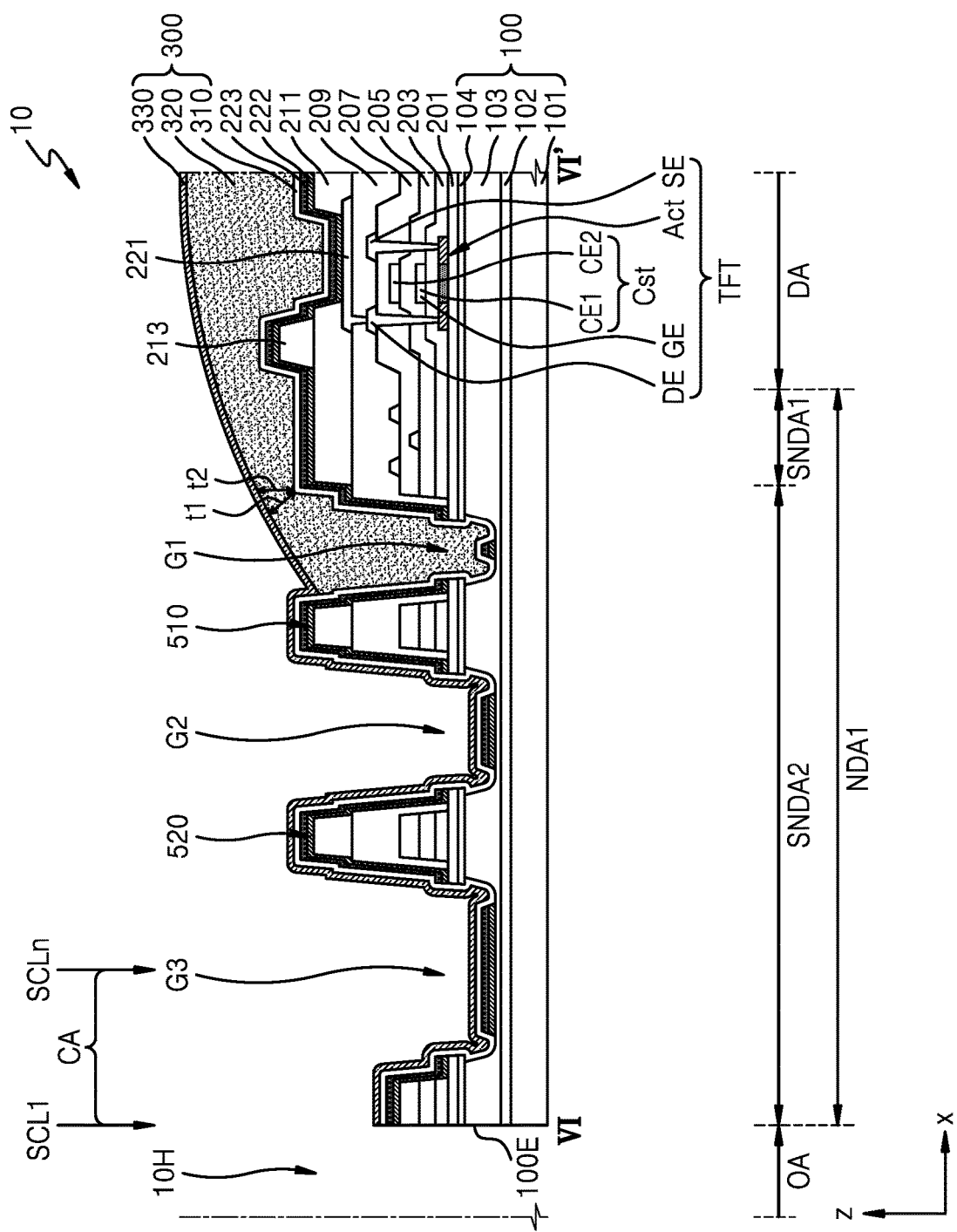
FIG. 12 is a cross-sectional view of a process of manufacturing a display panel according to an exemplary embodiment.

As described with reference to FIG. 11, when the thin-film encapsulation layer 300 is formed and a cutting or scribing process is performed along a first line SCL1, the display panel 10 including the opening 10H may be formed, as shown in FIG. 12. The opening 10H may be formed by using various methods such as laser cutting or a scribing process that uses a wheel, mechanical polishing, etc.

FIG. 12 may be understood as a cross-sectional view of the display panel 10 on which a cutting or scribing process has been performed along the first line SCL1 shown in FIG. 12. In another exemplary embodiment, an area from the first line SCL1 to an n-th line SCLn shown in FIG. 12 may be understood as a cutting area CA in a process of manufacturing a display panel. That is, a cutting or scribing process may be performed along one of lines from the first line SCL1 to the n-th line SCLn shown in FIG. 12, and a corresponding cross-sectional structure may correspond to a cross-sectional view of a display panel according to exemplary embodiment(s) of the invention.

The structure shown in FIG. 12 may be understood as a structure surrounding the opening area OA and/or the opening 10H. For example, a cross-section taken along line VI-VI' of FIG. 6 may correspond to a cross-sectional view of FIG. 12. Like the first to third grooves G1, G2, and G3 shown in FIG. 12 have a ring shape in plan view of FIG. 6, the first and second partition walls 510 and 520 shown in FIG. 12 may be understood as having a ring shape surrounding the opening area OA and/or the opening 10H in plan view. Also, the inorganic structure ST included in the first and second partition walls 510 and 520 may be understood as having a ring shape surrounding the opening area OA and/or the opening 10H in plan view. In plan view, when viewed in a direction perpendicular to a top surface of the substrate 100, a radius from the center of the opening area OA to the first partition wall 510 may be greater than a radius from the center of the opening area OA to the second partition wall 520.

Figure 13:
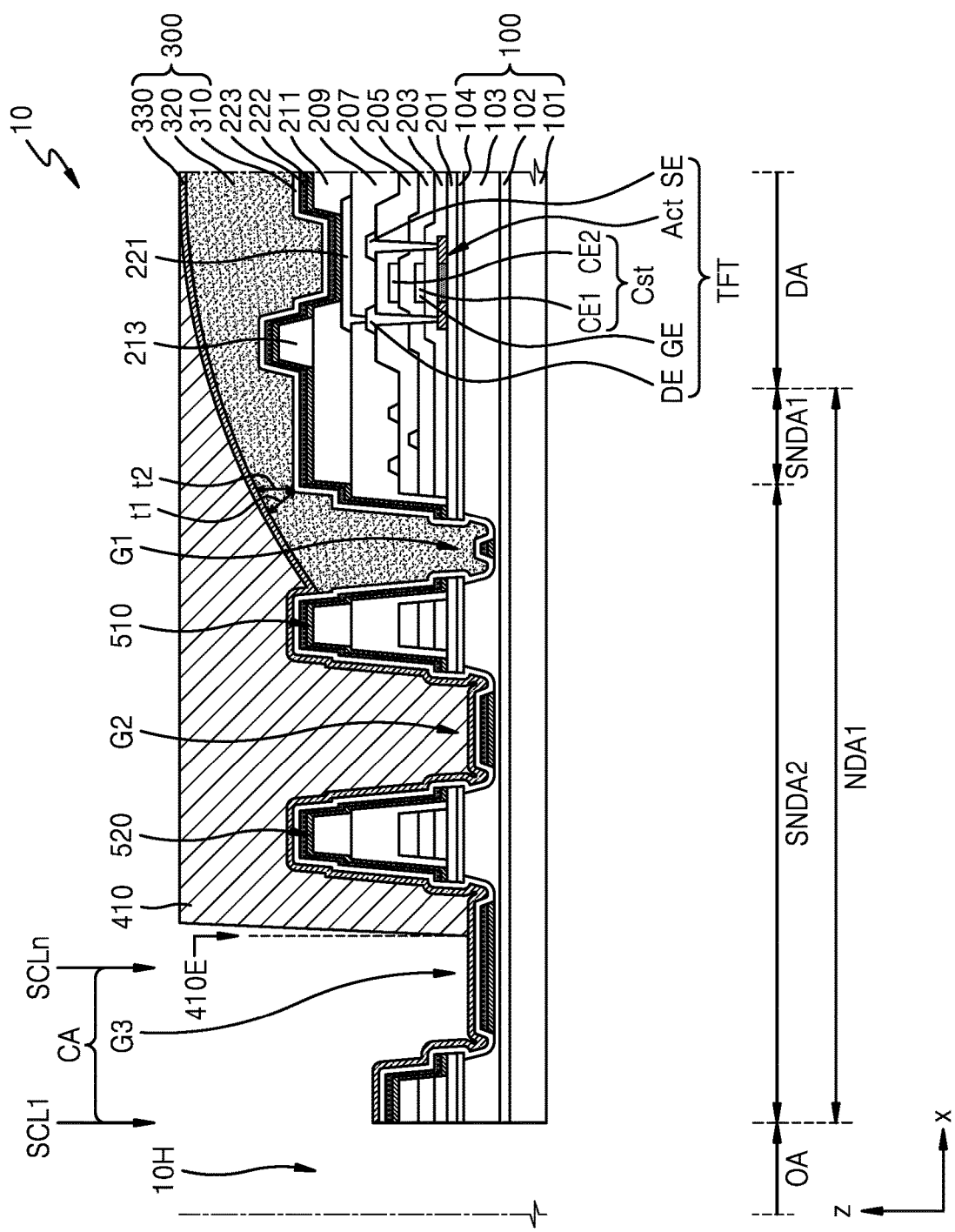
FIG. 13 is a cross-sectional view of a process of manufacturing a display panel according to another exemplary embodiment.

FIG. 13 is a cross-sectional view of a process of manufacturing a display panel according to another exemplary embodiment. FIG. 13 may be understood as a process after the process of manufacturing the display panel described with reference to FIG. 11. For example, as shown in FIG. 11, after the thin-film encapsulation layer 300 is formed, a process of forming a planarization layer 410 may be further performed as shown in FIG. 13.

The planarization layer 410 may include an organic insulating material. In an exemplary embodiment, the planarization layer 410 may be formed by coating a photoresist (a negative or positive photoresist) or a polymer-based organic material on the thin-film encapsulation layer 300 and patterning the same. An end 410E of the patterned planarization layer 410 may be located in the third groove G3, as shown in FIG. 13.

In another exemplary embodiment, the end 410E of the patterned planarization layer 410 may be further adjacent to the opening area OA than that shown in FIG. 13. In this case, a space of the third groove G3 over the second inorganic encapsulation layer 330 may be filled with the planarization layer 410.

The planarization layer 410 may improve flatness of the display panel 10 by covering an area, in which there is no organic encapsulation layer 320, of the second sub non-display area SNDA2. Therefore, an input sensing member or an optical functional member that is directly formed on the display panel 10 or coupled on the display panel 10 by using an adhesive layer may be prevented from being separated or detached from the display panel 10.

FIG. 13 may be understood to be a cross-sectional view of the display panel 10 on which a cutting or scribing process has been performed along the first line SCL1. However, the inventive concept is not limited thereto. An area from the first line SCL1 to the n-th line SCLn shown in FIG. 13 may be understood as a cutting area CA in a process of manufacturing a display panel. That is, a cutting or scribing process may be performed along one of lines from the first line SCL1 to the n-th line SCLn shown in FIG. 13, and a corresponding cross-sectional structure may correspond to a display panel according to exemplary embodiment(s) of the invention.

Figure 14:
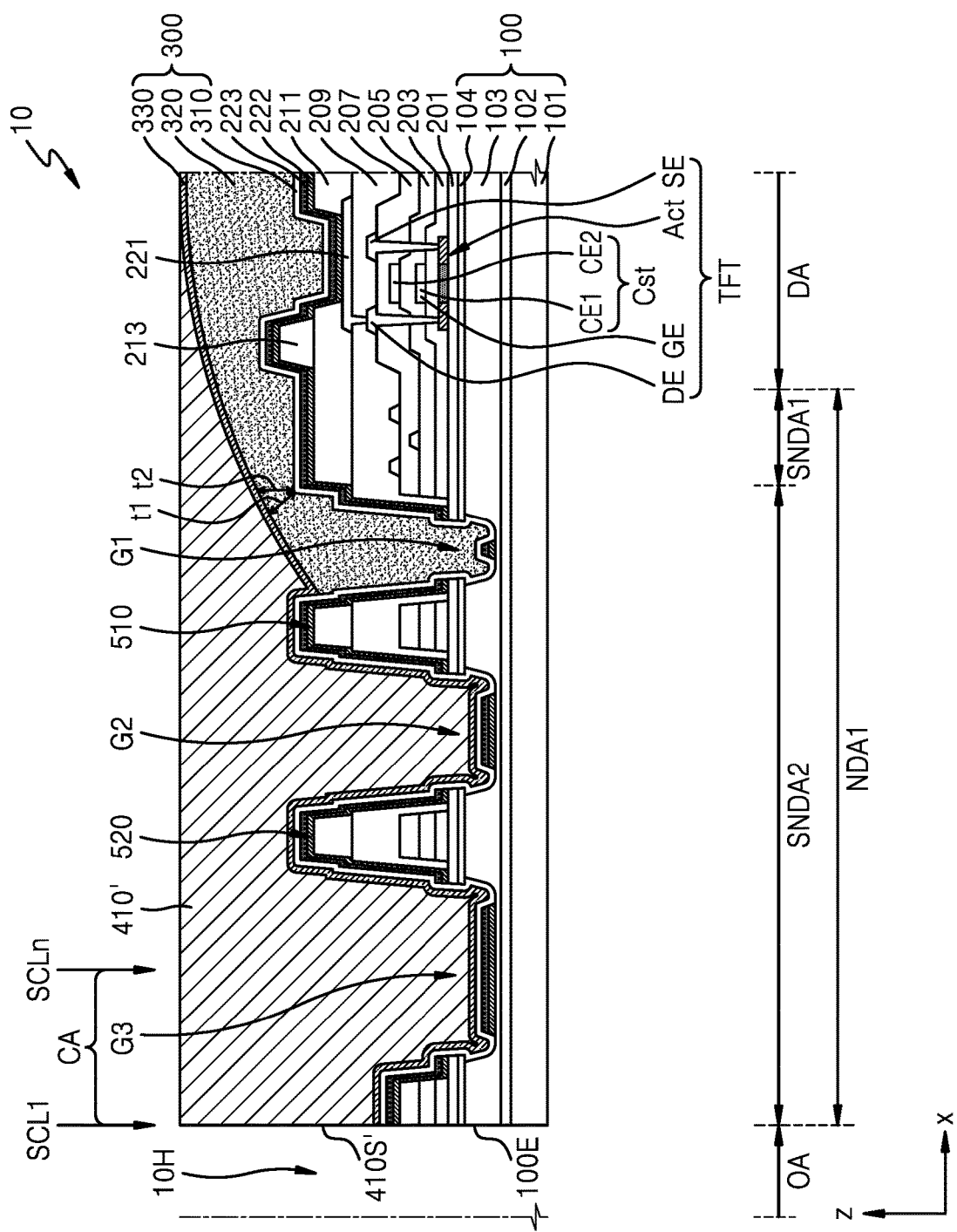
FIG. 14 is a cross-sectional view of a process of manufacturing a display panel according to another exemplary embodiment.

FIG. 14 is a cross-sectional view of a process of manufacturing a display panel according to another exemplary embodiment. FIG. 14 may be understood as a process occurring after the process of manufacturing the display panel described with reference to FIG. 11. For example, as shown in FIG. 11, after the thin-film encapsulation layer 300 is formed, a process of forming a planarization layer 410' may be further performed as shown in FIG. 14.

Unlike the planarization layer 410 of FIG. 13, a patterning process may not be additionally performed on the planarization layer 410' of FIG. 14. Therefore, in the case where a cutting or scribing process is performed along the first line SCL1 on the planarization layer 410', a lateral surface 410S' of the planarization layer 410' may be arranged on the same vertical line as an end 100E of the substrate 100.

FIG. 14 may be understood as a cross-sectional view of the display panel 10 on which a cutting or scribing process has been performed along the first line SCL1. However, the inventive concept is not limited thereto. An area from the first line SCL1 to an n-th line SCLn shown in FIG. 14 may be understood as a cutting area CA in a process of manufacturing a display panel. That is, a cutting or scribing process may be performed along one of lines from the first line SCL1 to the n-th line SCLn shown in FIG. 14, and a corresponding cross-sectional structure may also correspond to a display panel according to exemplary embodiment(s) of the invention.

The structure shown in FIGS. 13 and 14 may be understood as structures surrounding the opening area OA and/or the opening 10H. For example, the first and second partition walls 510 and 520 may have a ring shape surrounding the opening area OA and/or the opening 10H. Similarly, the planarization layers 410 and 410' may have a ring shape surrounding the opening area OA and/or the opening 10H while having a predetermined width. Alternatively, in another exemplary embodiment, the planarization layers 410 and 410' may cover an entire surface of the substrate 100. For example, the planarization layers 410 and 410' may entirely cover not only the first non-display area NDA1 but also the display area DA.

Figure 15:
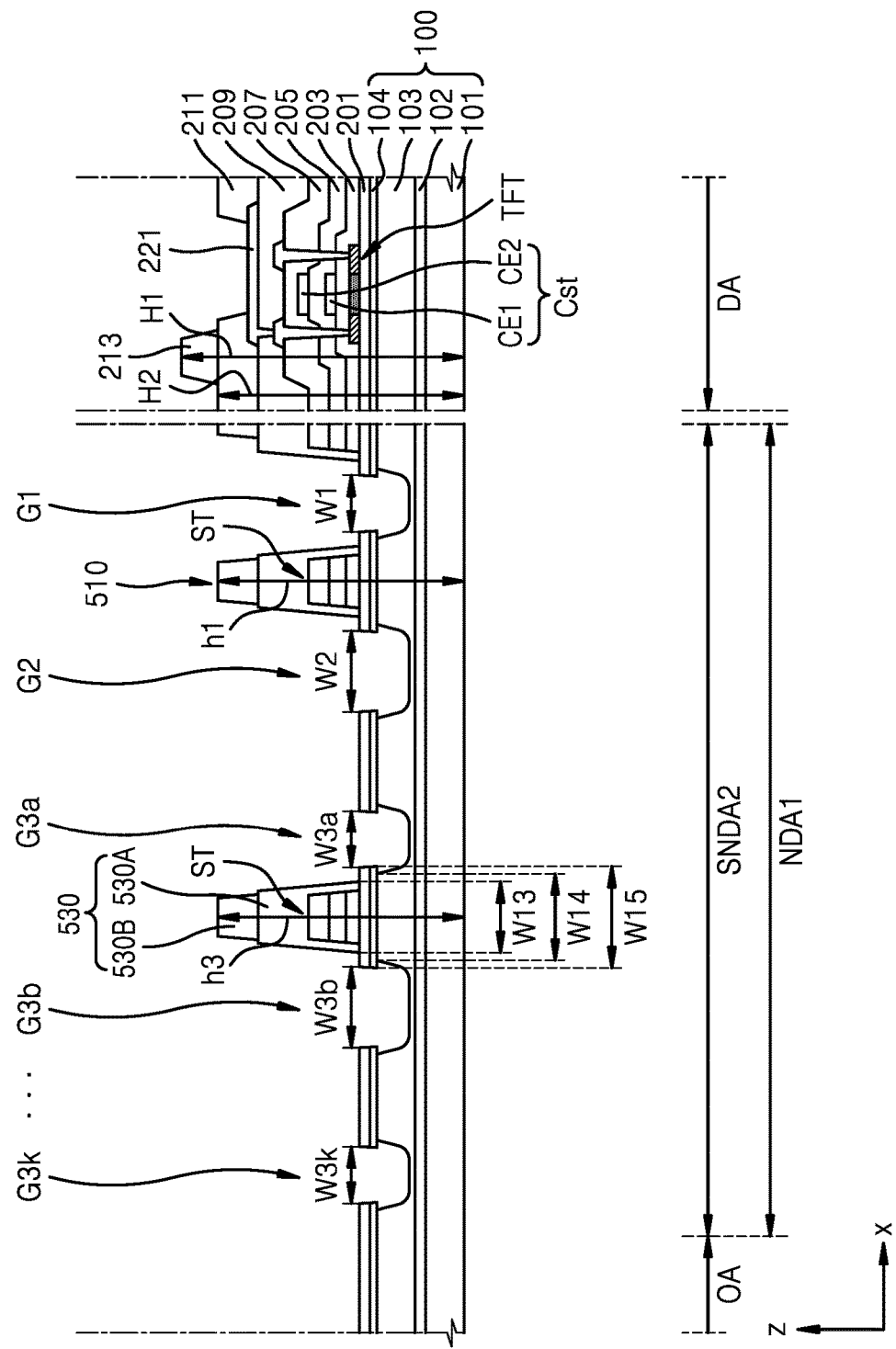
FIG. 15 is a cross-sectional view of a process of manufacturing a display panel according to another exemplary embodiment.
Figure 16:
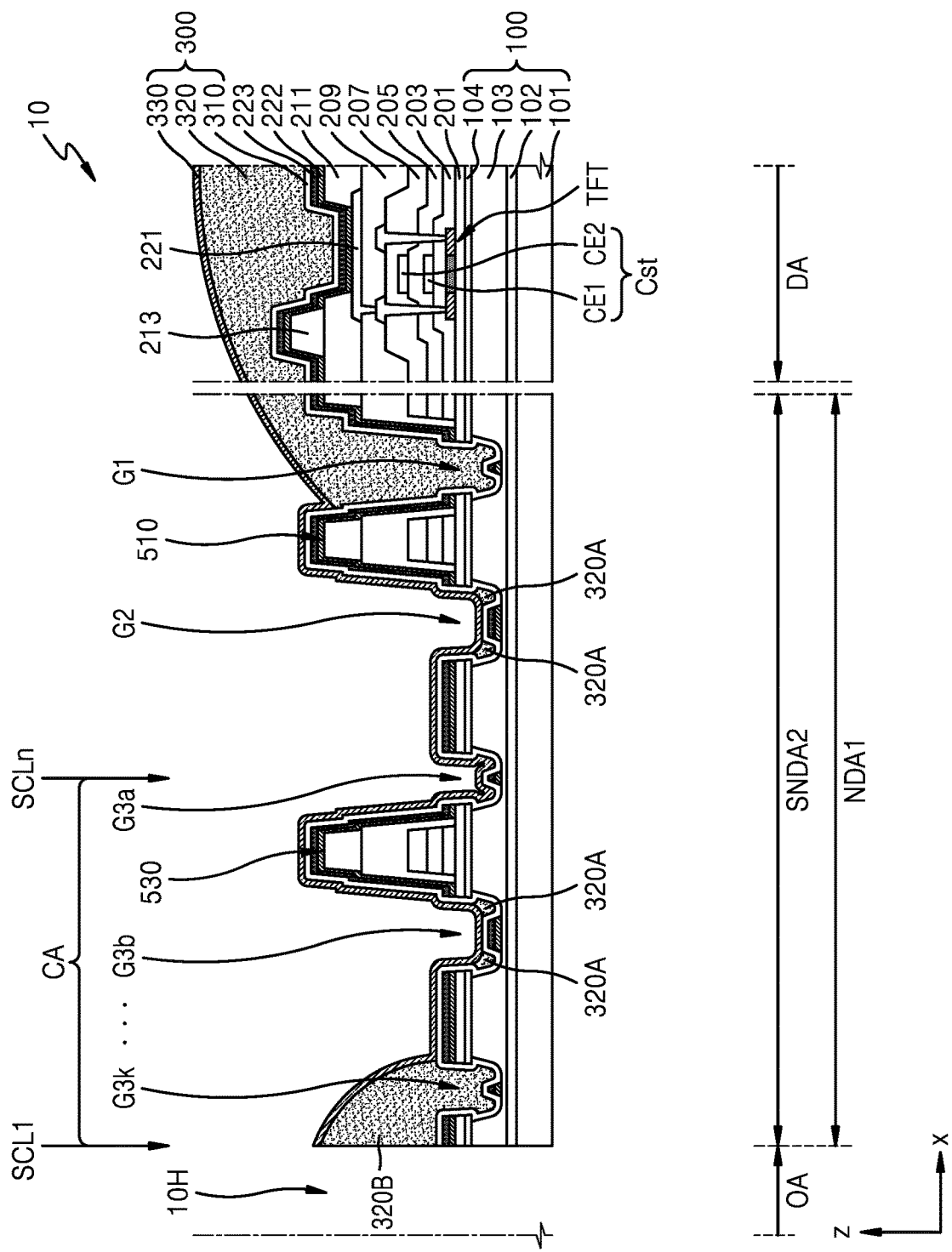
FIG. 16 is a cross-sectional view of a process of manufacturing a display panel according to another exemplary embodiment.

FIGS. 15 and 16 are cross-sectional views of a process of manufacturing a display panel according to another exemplary embodiment.

Referring to FIG. 15, since a stacking structure in the display area DA is the same as that of the display area DA of FIG. 7 described above, the second sub non-display area SNDA2, which is a portion of the first non-display area NDA1, is mainly described. Though the first non-display area NDA1 shown in FIG. 13 also includes the first sub non-display area SNDA1 in which data lines and/or scan lines are arranged as described above with reference to FIG. 7, the first sub non-display area SNDA1 has been omitted in FIG. 15.

Referring to the second sub non-display area SNDA2, the first groove G1, the second groove G2, and a plurality of third grooves G3a, G3b, . . . , G3k may be arranged from the display area DA toward the opening area OA. Each of the first groove G1, the second groove G2, and the plurality of third grooves G3a, G3b, . . . , G3k may have an undercut structure and specific description thereof is the same as the description made with reference to FIGS. 7 to 8A.

Widths of the first groove G1, the second groove G2, and the plurality of third grooves G3a, G3b, . . . , G3k may be the same or different from each other. With regard to this, FIG. 15 shows that the widths of the first groove G1, the second groove G2, and the plurality of third grooves G3a, G3b, . . . , G3k are different from each other.

In an exemplary embodiment, a second width W2 of the second groove G2 may be greater than a first width W1 of the first groove G1, a width W3a of a (3-1)st groove G3a may be less than the second width W2 of the second groove G2, and a width W3b of a (3-2)nd groove G3b may be greater than the width W3a of the (3-1)st groove G3a. As shown in FIG. 15, grooves having a relatively small width and grooves having a relatively large width may be alternately arranged in a direction from the display area DA toward the opening area OA.

In another exemplary embodiment, a width of each of the plurality of third grooves G3a, G3b, . . . , G3k may be the same as that of the first groove G1. In this case, the second groove G2 may have a width that is the same as or greater than the width of the first groove G1. In another exemplary embodiment, a width of each of the plurality of third grooves G3a, G3b, . . . , G3k may be less than a width of at least one of the first groove G1 and/or the second groove G2.

The first partition wall 510 may be arranged between the first and second grooves G1 and G2. The third partition wall 530 may be further adjacent to the opening area OA than the first partition wall 510. For example, the third partition wall 530 may be arranged between neighboring third grooves among the plurality of third grooves G3a, G3b, . . . , G3k. With regard to this, it is shown in FIG. 15 that the third partition wall 530 is arranged between the (3-1)st groove G3a and the (3-2)nd groove G3b.

Heights h1 and h3 respectively of the first and third partition walls 510 and 530 are less than the height H1 of the spacer 213 located in the display area DA. For example, differences between the height H1 of the spacer 213 and the heights h1 and h3 respectively of the first and third partition walls 510 and 530 may be about 1 μm or more.

The heights h1 and h3 respectively of the first and third partition walls 510 and 530 may be the same as the height H2 of the top surface of the second insulating layer 211. Alternatively, the heights h1 and h3 respectively of the first and third partition walls 510 and 530 may be greater than the height H2 of the top surface of the second insulating layer 211 and less than the height H1 of the spacer 213.

The third partition wall 530 may include a plurality of insulating layers. For example, the third partition wall 530 may include first and second partition wall layers 530A and 530B, which may include an organic insulating material. In an exemplary embodiment, the first partition wall layer 530A may be formed during the same process as a process of forming the first insulating layer 209 and may include the same material as that of the first insulating layer 209. The second partition wall layer 530B may be formed during the same process as a process of forming the second insulating layer 211 and may include the same material as that of the second insulating layer 211. The second partition wall layer 530B may be formed right on the first partition wall layer 530A, and a bottom surface of the second partition wall layer 530B may directly contact a top surface of the first partition wall layer 530A located thereunder.

An inorganic structure ST including a plurality of inorganic layers may be arranged under the first partition wall layer 530A of the third partition wall 530. For example, the inorganic structure ST may include a plurality of insulating layers including the same materials as those of the gate insulating layer 203 to the second interlayer insulating layer 207.

Although FIG. 15 shows that each of the first and third partition walls 510 and 530 includes the inorganic structure ST and the partition wall layers thereon, and each inorganic structure ST is an inorganic insulating layer, the inventive concept is not limited thereto. As described above with reference to FIG. 8C, the inorganic structure ST may further include metal layers. As described above, each of the heights h1 and h3 respectively of the first and third partition walls 510 and 530 may be based on thicknesses of the inorganic insulating layers and the metal layers included in the inorganic structure ST and the partition walls. Also, the heights h1 and h3 respectively of the first and third partition walls 510 and 530 may be adjusted by omitting at least one of the above-described layers.

A width of a bottom surface of the first partition wall 510 shown in FIG. 15 is less than a width between the first and second grooves G1 and G2. A structure related to this is the same as that described with reference to FIGS. 8A and 8B. For example, as described with reference to FIG. 8A, the width of the bottom surface of the first partition wall 510 may be less than the width between the first and second grooves G1 and G2 and may be less than a minimum horizontal distance between an inner surface of the second base layer 103 that constitutes the first groove G1 and an inner surface of the second base layer 103 that constitutes the second groove G2. Alternatively, as described with reference to FIG. 8B, the width of the bottom surface of the first partition wall 510 may be less than the width between the first and second grooves G1 and G2 and may be greater than the minimum horizontal distance between an inner surface of the second base layer 103 that constitutes the first groove G1 and an inner surface of the second base layer 103 that constitutes the second groove G2.

Similar to the first partition wall 510, a thirteenth width W13 of a bottom surface of the third partition wall 530 may be less than a distance (or a fifth width W15) between neighboring third grooves.

For example, as shown in FIG. 15, the thirteenth width W13 of the bottom surface of the third partition wall 530 may be less than the fifth width W15, which is a horizontal distance between the (3-1)st groove G3a and the (3-2)nd groove G3b, and may be less than a fourteenth width W14, which is a minimum horizontal distance between an inner surface of the second base layer 103 that constitutes the (3-1)st groove G3a and an inner surface of the second base layer 103 that constitutes the (3-2)nd groove G3b.

Alternatively, though not shown, the thirteenth width W13 of the bottom surface of the third partition wall 530 may be less than the fifth width W15, which is the horizontal distance between the (3-1)st groove G3a and the (3-2)nd groove G3b, and may be greater than the fourteenth width W14, which is the minimum horizontal distance between the inner surface of the second base layer 103 that constitutes the (3-1)st groove G3a and the inner surface of the second base layer 103 that constitutes the (3-2)nd groove G3b.

Referring to FIG. 16, the intermediate layer 222 and the opposite electrode 223 are formed over the substrate 100 in which the grooves have been formed. The first and second functional layers of the intermediate layer 222 and the opposite electrode 223 may cover the entire surface of the substrate 100 and are disconnected by the first and second grooves G1 and G2 and the plurality of third grooves G3a, G3b, . . . , G3k. A specific configuration related to this is the same as that described above with reference to FIG. 10.

After that, the inorganic encapsulation layer 310, the organic encapsulation layer 320, and the second inorganic encapsulation layer 330 may be sequentially formed on the opposite electrode 223. After the thin-film encapsulation layer 300 is formed, when a cutting or scribing process is performed along the first line SCL1, the display panel 10 including the opening 10H may be formed as shown in FIG. 16.

Since the first inorganic encapsulation layer 310 formed by CVD has an excellent step coverage, the first inorganic encapsulation layer 310 may entirely cover inner surfaces of the grooves without disconnection.

The organic encapsulation layer 320 may be formed by coating a monomer and hardening the same. The monomer may be coated to cover the display area DA and the opening area OA during a manufacturing process. The monomer coated in the opening area OA may fill at least a portion of a (3-k)-th groove G3k that neighbours the opening area OA among the plurality of third grooves.

A material (an organic material formed while the monomer is hardened) existing right on the opening area OA is removed by a cutting or scribing process performed after the thin-film encapsulation layer 300 is formed. Therefore, in the display panel 10, an organic material (referred to as an organic insulating layer 320B, hereinafter) may remain only in the third groove G3k that neighbours the opening area OA as shown in FIG. 16, and the organic insulating layer 320B includes the same material as that of the organic encapsulation layer 320. The organic insulating layer 320B may alleviate stress or an impact during the cutting or scribing process and thus may prevent or minimize generation of a crack or floating of a layer around the opening 10H.

During a process of forming the organic encapsulation layer 320, the monomer is dropped on the substrate 100 through a process such as an inkjet, and a portion of the dropped monomer falls down around the substrate 100 and may be immediately hardened. Alternatively, a portion of the organic insulating material formed when the monomer is hardened may be removed through a process such as ashing. In this case, there may be the organic insulating material that is not yet removed on the substrate 100. For example, as shown in FIG. 16, there may be an organic material 320A in the second groove G2 and the (3-2)nd groove G3b, and the organic material 320A may include the same material as that of the organic encapsulation layer 320. The organic material 320A may be a residue that remains on the substrate 100 during a process of forming the organic encapsulation layer 320. There may be a small amount of the organic material 320A under the eaves of the second groove G2 and the (3-2)nd groove G3b, that is, under the tip.

The second inorganic encapsulation layer 330 covers the organic encapsulation layer 320 in the display area DA. The second inorganic encapsulation layer 330 may cover the organic material 320A and the organic insulating layer 320B in the first non-display area NDA1. The second inorganic encapsulation layer 330 may extend to cover the first non-display area NDA1 and directly contact the first inorganic encapsulation layer 310 on a partial area, for example, the second sub non-display area SNDA2.

FIG. 16 may be understood as a cross-sectional view of the display panel 10 on which the cutting or scribing process has been performed along the first line SCL1. However, the inventive concept is not limited thereto. That is, the cutting or scribing process may be performed along one of lines from the first line SCL1 to an n-th line SCLn shown in FIG. 16, and a corresponding cross-sectional structure may also correspond to a display panel according to exemplary embodiment(s) of the invention.

Figure 17:
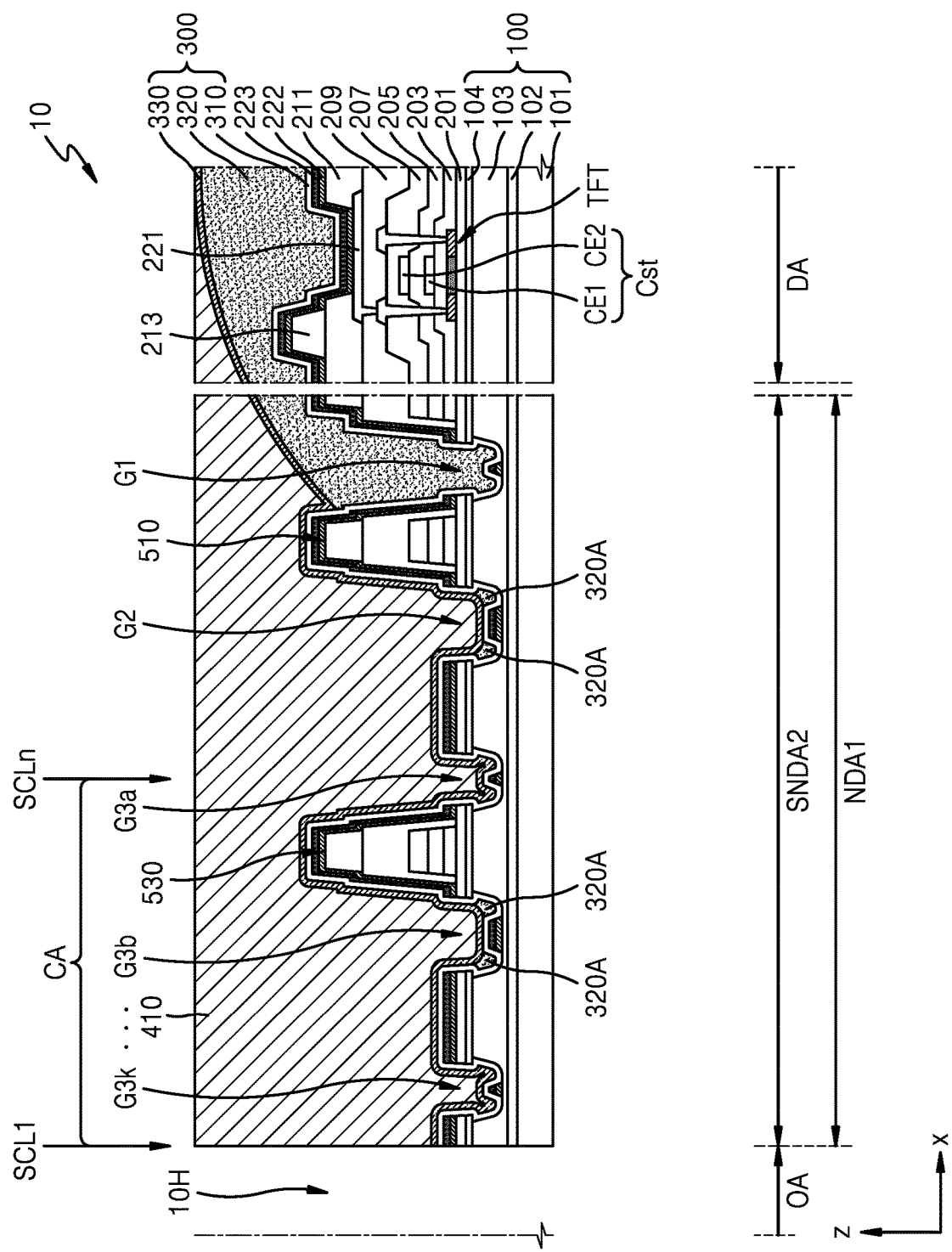
FIG. 17 is a cross-sectional view of a display panel according to another exemplary embodiment.

FIG. 17 is a cross-sectional view of a display panel according to another exemplary embodiment. FIG. 17 may be understood as adding a process of further forming the planarization layer 410 between a process of forming the thin-film encapsulation layer 300 of the display panel described with reference to FIG. 16, and the cutting or scribing process.

Referring to FIG. 17, after the thin-film encapsulation layer 300 is formed, and before the cutting or scribing process is performed, the planarization layer 410 may be formed over the substrate 100. The planarization layer 410 may include an organic insulating material. The planarization layer 410 may be formed by coating a photoresist (a negative or positive photoresist) or a polymer-based organic material on the thin-film encapsulation layer 300. During the process of manufacturing the display panel 10, the planarization layer 410 may exist right on the opening area OA but may be removed by the cutting or scribing process along the first line SCL1. The planarization layer 410 may prevent an input sensing member or an optical functional member that is directly formed on the display panel 10 or attached on the display panel 10 from being separated from the display panel 10.

FIG. 17 may be understood as a cross-sectional view of the display panel 10 on which the cutting or scribing process has been performed along the first line SCL1. However, the inventive concept is not limited thereto. In another exemplary embodiment, an area from the first line SCL1 to an n-th line SCLn shown in FIG. 17 may be understood as a cutting area CA in a process of manufacturing the display panel. Therefore, the display panel manufactured while the cutting or scribing process is performed along one of lines from the first line SCL1 to the n-th line SCLn may correspond to an exemplary embodiment of the invention.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the disclosure as defined by the following claims.

The invention claimed is:

1. A display panel comprising:
   a substrate including an opening area and a display area surrounding the opening area;
   a plurality of display elements arranged in the display area, each comprising a pixel electrode, an emission layer, and a portion of an opposite electrode;
   a thin-film encapsulation layer covering the plurality of display elements and comprising an organic encapsulation layer and an inorganic encapsulation layer;
   a plurality of grooves located between the opening area and the display area, each of the plurality of grooves having an undercut structure; and
   a partition wall located between the opening area and the display area,
   wherein an organic material layer between the pixel electrode and the opposite electrode comprises:

a first portion and a second portion disposed on both sides of each of the plurality of grooves, respectively; and a third portion between the first portion and the second portion, the third portion being in each of the plurality of grooves and separated from the first and second portions.

2. The display panel of claim 1, wherein the partition wall comprises at least one partition wall layer including an organic insulating material.

3. The display panel of claim 2, further comprising:

an inorganic layer interposed between the substrate and the at least one partition wall layer, wherein a top surface and a lateral surface of the inorganic layer are covered by the at least one partition wall layer.

4. The display panel of claim 1, further comprising:

a pixel-defining layer located in the display area, covering edges of the pixel electrode, and including an opening corresponding to the pixel electrode; and a spacer arranged on a top surface of the pixel-defining layer.

5. The display panel of claim 4, wherein a first height from the substrate to a top surface of the partition wall is less than a second height from the substrate to a top surface of the spacer.

6. The display panel of claim 5, wherein a difference between the first height and the second height is greater than or equal to 1 μm.

7. The display panel of claim 5, wherein the first height is greater than a third height from the substrate to the top surface of the pixel-defining layer and less than the second height.

8. The display panel of claim 4, wherein the pixel-defining layer and the spacer include an organic insulating material.

9. The display panel of claim 1, wherein a width of a bottom surface of the partition wall is less than a horizontal distance between neighboring grooves among the plurality of grooves.

10. The display panel of claim 1, wherein the partition wall has a ring shape surrounding the opening.

* * * * *